US009997850B2

(12) United States Patent
Hong et al.

(10) Patent No.: US 9,997,850 B2
(45) Date of Patent: Jun. 12, 2018

(54) ELECTRONIC DEVICE INCLUDING CONNECTOR

(71) Applicant: Samsung Electronics Co., Ltd., Gyeonggi-do (KR)

(72) Inventors: Eun-Seok Hong, Gyeonggi-do (KR); Won-Seob Kim, Seoul (KR)

(73) Assignee: Samsung Electronics Co., Ltd (KR)

( * ) Notice: Subject to any disclaimer, the term of this patent is extended or adjusted under 35 U.S.C. 154(b) by 0 days. days.

(21) Appl. No.: 15/073,017

(22) Filed: Mar. 17, 2016

(65) Prior Publication Data

US 2016/0344120 A1  Nov. 24, 2016

(30) Foreign Application Priority Data

May 22, 2015 (KR) ........................ 10-2015-0071975

(51) Int. Cl.
*H01R 12/71* (2011.01)
*H05K 1/11* (2006.01)
*H01R 12/72* (2011.01)
*H01R 107/00* (2006.01)

(52) U.S. Cl.
CPC ......... *H01R 12/716* (2013.01); *H01R 12/724* (2013.01); *H05K 1/111* (2013.01); *H01R 2107/00* (2013.01)

(58) Field of Classification Search
CPC .. H01R 12/526; H01R 12/707; H01R 12/724; H01R 23/7073; H01R 9/091; H01R 12/52; H01R 12/716; H01R 2107/00; H05K 1/111
USPC ................................ 439/83, 78, 79, 951, 108
See application file for complete search history.

(56) References Cited

U.S. PATENT DOCUMENTS

| | | | |
|---|---|---|---|
| 5,194,021 A | 3/1993 | Oba et al. | |
| 6,250,935 B1 * | 6/2001 | Mochizuki | H01R 23/6873 439/108 |
| 7,156,675 B2 * | 1/2007 | Nagata | H01R 24/46 439/188 |
| 7,585,185 B2 * | 9/2009 | Obikane | H01R 13/65802 439/108 |
| 8,485,851 B2 * | 7/2013 | Kondo | H01R 13/6474 439/660 |
| 8,531,348 B2 * | 9/2013 | Wu | H01Q 1/243 343/700 MS |
| 8,851,927 B2 * | 10/2014 | Hsu | H01R 12/724 439/607.11 |
| 9,048,554 B2 * | 6/2015 | Tagawa | H01R 12/707 |
| 9,065,214 B2 * | 6/2015 | Nakashima | H01R 13/6585 |
| 9,124,352 B2 * | 9/2015 | Soekawa | H04B 1/40 |

(Continued)

OTHER PUBLICATIONS

USB 3.0 Promoter Group, et al., Universal Serial Bus Type-C Cable and Connector Specification Release 1.0, Revision 1.0, Aug. 11, 2014.

*Primary Examiner* — Tulsidas C Patel
*Assistant Examiner* — Travis Chambers
(74) *Attorney, Agent, or Firm* — The Farrell Law Firm, P.C.

(57) ABSTRACT

An electronic device is provided. The electronic device includes a circuit board including multiple lands arranged on a surface, and an electrical receptacle including multiple contacts electrically connected to the multiple lands, the electrical receptacle being installed on the circuit board, where at least two contacts are connected to at least one land among the multiple lands.

18 Claims, 31 Drawing Sheets

(56) References Cited

U.S. PATENT DOCUMENTS

| | | | | |
|---|---|---|---|---|
| 9,620,904 | B2* | 4/2017 | Kao | H01R 13/6581 |
| 2006/0258230 | A1* | 11/2006 | Pan | H01R 13/514 |
| | | | | 439/790 |
| 2011/0086546 | A1* | 4/2011 | Mao | H01R 12/7052 |
| | | | | 439/607.4 |
| 2015/0229077 | A1* | 8/2015 | Little | H01R 12/724 |
| | | | | 439/78 |
| 2015/0333451 | A1* | 11/2015 | Kao | H01R 24/60 |
| | | | | 439/607.01 |
| 2015/0340798 | A1* | 11/2015 | Kao | H01R 13/516 |
| | | | | 439/660 |
| 2016/0013599 | A1* | 1/2016 | Ueda | H01R 13/6596 |
| | | | | 439/607.01 |

* cited by examiner

ELECTRONIC DEVICE INCLUDING CONNECTOR

PRIORITY

This application claims priority under 35 U.S.C. § 119(a) to Korean Patent Application No. 10-2015-0071975, which was filed in the Korean Intellectual Property Office on May 22, 2015, the entire content of which is incorporated herein by reference.

BACKGROUND

1. Field of the Disclosure

The present disclosure relates generally to an electronic device including a connector, which electrically connects between electric elements.

2. Description of the Related Art

In general, kinds of interfaces (e.g., ports or cables), which are used to connect computers with peripheral devices, have been highly diversified, and so too have been methods for connecting and using them. Therefore, it is often difficult for those without professional knowledge of computers to connect peripheral devices to computers. In particular, many users find it difficult to know what cable is to be plugged into what port when a specific peripheral device is to be connected to the computer; and then to determine what settings should be made, after connection, for operation of the device.

This poses problems not only for users, but also for manufacturers of computers and peripheral devices alike. This is because, if various peripheral devices use different specifications of communication schemes, it is often confusing to determine what interfaces a computer should be provided with, and to determine what interface a peripheral device is to be designed with.

Such a problem would be substantially solved if all computer peripheral devices use the same standard of interface, and if they become ready to use as soon as they are connected to the computer, without any separation operation. Furthermore, convenience would be multiplied if a connected peripheral device could operate on its own, i.e. without connecting to a separate external power supply.

Universal Serial Bus (USB) communication has appeared as a standard interface in order to solve the above problem. The most noticeable feature of USB communication is convenience. It supports a plug-and-play function so that, when a peripheral device is plugged in, the computer instantly recognizes its connection. However, some USB communication devices may require additional software installation. In addition, while most other types of interfaces require that the computer be powered off before connecting a device, USB communication supports a hot swapping function so that a peripheral device can be connected, disconnected, or exchanged even when the computer is powered on. The USB communication is also characterized by a feature which uses the port of the computer to supply power to peripheral devices on its own. Among USB communication specification products, small devices such as mice, keyboards, and external hard disks mostly operate with no connection to a separate power supply, and there are even large devices, such as printers and scanners, that can operate with no separate power supply. Furthermore, such characteristics of USB communication can also be used to charge mobile devices such as mobile phones and MP3 players. Thanks to the above-mentioned advantages, there are various computer peripheral devices developed according to the USB communication specifications, such as mice, keyboards, printers, scanners, and webcams.

Currently, continued development of electronic communication industries has made user devices, such as mobile communication terminals (cellular phones), electronic organizers, and personal complex terminals, indispensable products in modern societies. Such user devices have become capable of providing not only voice communication services, but also various data transmission services and diversified additional services, changing into multimedia communication devices in terms of their functions.

Such user devices include antennas for wireless communication. Such antennas tend to evolve into embedded antennas, which are equipped inside user devices. For example, an antenna is implemented as a conductive pattern on a circuit board. Electronic components for various functions are installed on a circuit board, and there are efforts to reduce the size of such electronic components; however, there are still difficulties in securing an area on the circuit board, in which a conductive pattern is to be installed for an antenna.

SUMMARY

The present disclosure has been made to address at least the problems and disadvantages described above, and to provide at least the advantages described below.

Accordingly, an aspect of the present disclosure is to provide an electronic device including a connector, which is configured such that the area occupied by electronic components on a circuit board is reduced, thereby securing an area for installing an antenna.

According to an embodiment of the present disclosure, the size of the connector can be reduced, thereby securing an area for antenna installation on the circuit board, and improving the performance of the antenna.

In accordance with an aspect of the present disclosure, an electronic device is provided. The electronic device includes a circuit board including multiple lands arranged on a surface, and an electrical receptacle including multiple contacts electrically connected to the multiple lands, the electrical receptacle being installed on the circuit board. at the at least two contacts are connected to at least one land among the multiple lands.

In accordance with another aspect of the present disclosure, an electronic device is provided. The electronic device includes a circuit board including multiple lands arranged on a surface in one row, and an electrical receptacle including multiple contacts electrically connected to the multiple lands, the electrical receptacle being installed on the circuit board. The electrical receptacle includes only multiple contacts corresponding to a communication specification of a lower version supported by the electronic device.

BRIEF DESCRIPTION OF THE DRAWINGS

The above and other aspects, features, and advantages of the present disclosure will be more apparent from the following detailed description taken in conjunction with the accompanying drawings, in which.

Figure 1:
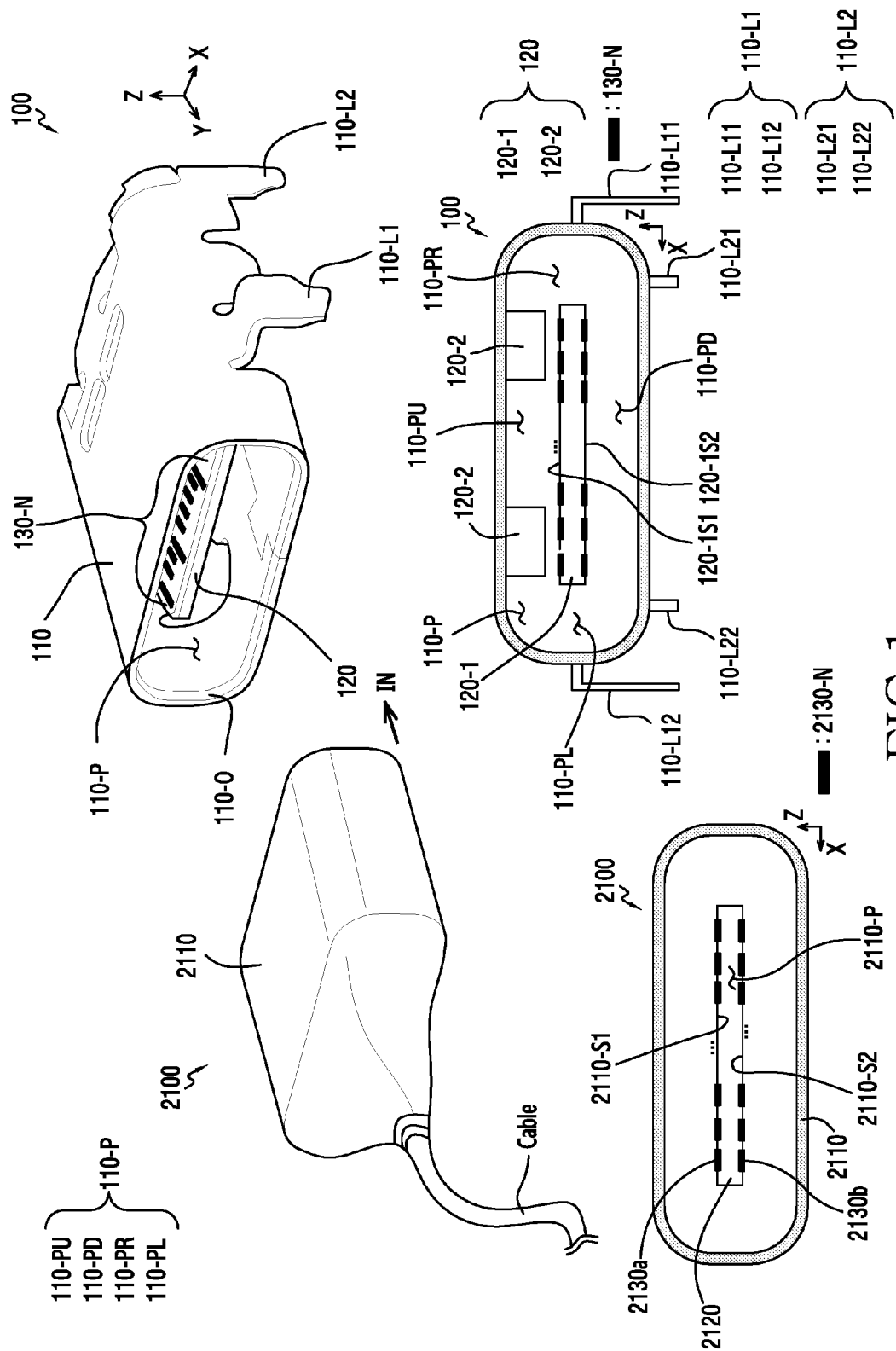
FIG. 1 illustrates connectors, according to an embodiment of the present disclosure.

DETAILED DESCRIPTION OF EMBODIMENTS
OF THE PRESENT DISCLOSURE

Various embodiments of the present disclosure will be described herein with reference to the accompanying drawings, in which like reference numbers are used to depict the same or similar elements, features, and structures. Various modifications and changes to the embodiments of the present invention may be made without departing from the scope and spirit of the present disclosure. Specific embodiments are illustrated in the drawings and a related detailed description is made. However, the embodiments described herein are not intended to limit the present disclosure to a specific embodiment form, and should be understood as including all modifications and/or equivalents or alternatives included in the spirit and technological scope of the present disclosure.

The expressions "comprise" and "may comprise" as used herein indicate the existence of disclosed corresponding functions, operations, or constituent elements, etc. and do not limit additional functions, operations, or constituent elements, etc. Also, the terms "comprise" and "have", should be understood as being intended to designate the existence of features stated in the specification, numerals, steps, operations, constituent elements, components or a combination of them, and not previously excluding the possibility of the existence or addition of one or more other features, numerals, steps, operations, constituent elements, components or combinations of them.

As used herein, the expression "or" includes any and all combinations of words enumerated together. For example, "A or B" may include A, or may include B, or may include A and B.

The expressions "1st", "2nd", "first" or "second", etc. as used herein may modify various constituent elements, but are not intended to limit corresponding constituent elements. For example, the expressions do not limit the order and/or importance of the corresponding constituent elements. The expressions may be used to distinguish one constituent element from another constituent element. For example, both of a first user device and a second user device are user devices, and represent user devices different from one another. For example, a first constituent element may be referred to as a second constituent element without departing from the scope of the present disclosure. Likewise, a second constituent element may be referred to as a first constituent element.

When it is mentioned that a constituent element is "connected" to or "accessed" by another constituent element, it should be understood that the first constituent element may not only be directly connected to or accessed by the second constituent element, but also a new third constituent element may exist between the first constituent element and the second constituent element. On the other hand, when it is mentioned that a constituent element is "directly connected" to or "directly accessed" by another constituent element, it should be understood that no third constituent element exists between the first constituent element and the second constituent element.

The terms used herein are used merely to explain specific embodiments of the present disclosure, and are not intended to limit the various embodiments of the present disclosure.

An expression of singular number includes the expression of plural number unless the context clearly dictates otherwise.

Unless defined otherwise, all terms used herein, including technological or scientific terms, have the same meaning as those commonly understood by a person having ordinary knowledge in the art to which the present disclosure belongs. Terms as defined in a general dictionary should be interpreted as having meanings consistent with the contextual meanings of a related technology, and should not be interpreted as ideal or excessively formal meanings unless explicitly defined herein.

An electronic device, according to various embodiments of the present disclosure, may be a device including a display function. For example, the electronic device may include at least one of a smart phone, a tablet Personal Computer (PC), a mobile phone, a video phone, an electronic book (e-book) reader, a desktop PC, a laptop PC, a netbook computer, a Personal Digital Assistant (PDA), a Portable Multimedia Player (PMP), an MPEG Audio Layer 3 (MP3) player, a mobile medical instrument, a camera, or a wearable device (e.g., a Head-Mounted Device (HMD) such as electronic glasses, electronic clothes, an electronic bracelet, an electronic necklace, an electronic appcessory, an electronic tattoo, or a smart watch).

According to some embodiments, the electronic device may be a smart home appliance having a display function. The smart home appliance, for example, the electronic device may include at least one of a television, a Digital Video Disk (DVD) player, an audio system, a refrigerator, an air conditioner, a cleaner, an oven, a microwave, a washing machine, an air cleaner, a set-top box, a TV box (for example, Samsung HomeSync™, Apple TV™, or Google TV™), a game console, an electronic dictionary, an electronic locking system, a camcorder, or an electronic picture frame.

According to some embodiments, the electronic device may include at least one of various medical instruments (e.g., Magnetic Resonance Angiography (MRA) machine, Magnetic Resonance Imaging (MRI) machine, Computerized Tomography (CT) machine, a moving camera, an ultrasonic machine, etc.), a navigation device, a Global Positioning System (GPS) receiver, an Event Data Recorder (EDR), a Flight Data Recorder (FDR), a car infotainment device, an electronic equipment for ship (e.g., a navigation device for a ship and a gyrocompass, etc.), avionics, a security instrument, a head unit for vehicles, an industrial or home service robot, an Automatic Teller's Machine (ATM), or a Point Of Sales (POS) machine.

According to some embodiments, the electronic device may include at least one of a part of furniture or building/structure including a display function, an electronic board, an electronic signature receiving device, a projector, or various metering instruments (e.g., tap water, electricity, gas, or radio wave metering instrument, etc.).

The electronic device according to various embodiments of the present disclosure may be one of the aforementioned various devices or a combination of two or more of them. Also, the electronic device according to various embodiments of the present disclosure may be a flexible device. Also, the electronic device according to various embodiments of the present disclosure is not limited to the aforementioned instruments.

The term 'user' used herein may denote a person who uses the electronic device or a device (e.g., an artificial-intelligence electronic device) which uses the electronic device.

Figure 2:
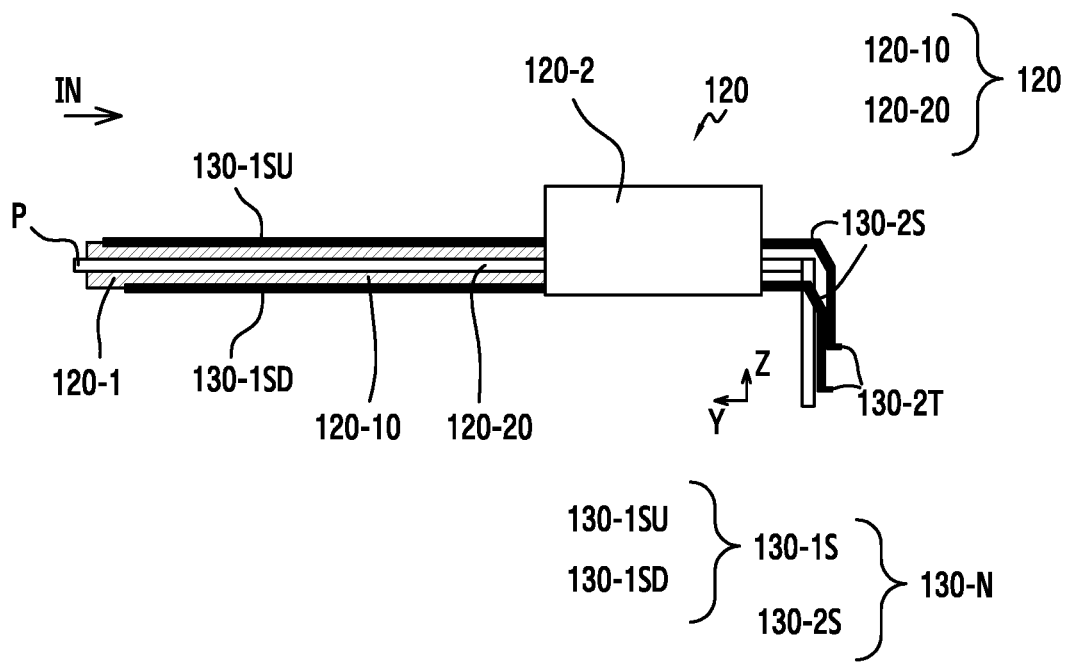
FIG. 2 illustrates a receptacle tongue and multiple receptacle contacts of a receptacle tongue, according to an embodiment of the present disclosure.

FIG. 1 illustrates connectors, according to an embodiment of the present disclosure. FIG. 2 illustrates a receptacle tongue and multiple receptacle contacts of a receptacle, according to an embodiment of the present disclosure.

Referring to FIGS. 1 and 2, the connectors may include a receptacle 100 and a plug 2110.

The receptacle 100 is an element that can be electrically connected to the plug 2100. The receptacle 100 includes a receptacle shell 110, a receptacle tongue 120, and multiple receptacle contacts 130-N.

The receptacle shell 110 approximates the shape of a container including a passage 110-P, through which the plug 2100 can be inserted. The receptacle shell 110 includes an opening 110-O, which becomes an entry/exit of the passage 110-P, and the plug 2100 can be moved into the passage 110-P of the receptacle shell 110 via the opening 110-O. When viewed from the cross-section, the opening 110-O has a width larger than that of the passage 110-P and facilitates insertion of the plug 2100 into the passage 110-P.

The passage 110-P of the receptacle shell 110 extends straight, and the plug 2100 may be guided by the passage 110-P of the receptacle shell 110 and inserted into the receptacle 100.

When viewed from the cross-section, the passage 110-P of the receptacle shell 110 may include an upper passage 110-PU, a low passage 110-PD, a left passage 110-PL, and a right passage 110-PR that encloses a free end portion 120-1 of the a receptacle tongue 120. The upper passage 110-PU and the lower passage 110-PD are opposite from one another, and are symmetrical. The left passage 110-PL and the right passage 110-PR are opposite from one another, and are symmetrical.

The plug 2100 includes a plug shell 2110 that may be inserted into the passage 110-P of the receptacle shell 110 without distinction of up or down. The plug shell 2100 includes a passage 2100-P in which the free end portion 120-1 of the receptacle tongue 120 is inserted when the plug 2100 and the receptacle 100 are coupled with each other.

The receptacle shell 110 may be molded using a non-conductive material or a conductive material. Particularly, the receptacle shell 110 may be molded using a conductive material (for example, stainless steel or phosphor bronze), electrically connected to a circuit board (or Printed Circuit Board (PCB)), and used as a ground return path. The ground return path can improve Electro Magnetic Compatibility (EMC).

The receptacle shell 110 may further include a spring portion shaped to protrude into the passage (110-P). In this case, when the plug 2100 is introduced into the passage 100-P of the receptacle 100, the spring portion may undergo deformation of elastic bending so as to elastically pressurize the surface of the plug shell 2110 of the plug 2100. The metallic receptacle shell 110 and the metallic plug shell 2110 may be electrically connected via the spring portion.

The receptacle shell 110 includes multiple leads 110-L1 and 110-L2 shaped to protrude to the outside of the passage (110-P). The multiple leads 110-L1 and 110-L2 are used to couple the receptacle 100 to the circuit board. At least one lead 110-L1 may be shaped such that it extends in the horizontal direction (for example, x-axis direction) from a side portion of the receptacle shell 110 and then bends in the vertical direction (z-axis direction). Alternatively, at least one lead 110-L2 may extend from the bottom of the receptacle shell 110 in the vertical direction (z-axis direction).

The receptacle tongue 120 includes a fixed portion 120-2, which is fixed to the receptacle shell 110, and a free end portion 120-1, which extends from the fixed portion 120-2 and is arranged inside the passage 110-P of the receptacle shell 110.

When viewed in cross-section, the free end portion 120-1 of the receptacle tongue 120 is shaped to approximately have upper/lower and left/right symmetry. For example, the free end portion 120-1 of the receptacle tongue 120 may have the shape of a plate having a predetermined thickness, and may extend in the direction (y-axis direction) of the passage 110-P of the receptacle shell 110.

The free end portion 120-1 of the receptacle tongue 120 is arranged so as not to contact the inner surface of the passage 110-P of the receptacle shell 110. The passage 110-P of the receptacle shell 110 is divided into an upper passage 110-PU and a lower passage 110-PD with reference to the free end portion 120-1 of the receptacle tongue 120.

The receptacle tongue 120 includes a base plate 120-10 molded using a non-conductive material (for example, glass-filled nylon) and a mid-plate 120-20 arranged inside the base plate 120-10. The base plate 120-10 may be molded using a conductive material (such as stainless steel), and is used as a part on which multiple receptacle contacts 130-N (described later) are arranged. In addition, the mid-plate 120-20 may be electrically connected to the circuit board and used as a ground return path. Furthermore, the mid-plate 120-20 protrudes (P) to the front of the receptacle tongue 120, and prevents the receptacle tongue 120 from being damaged by an erroneous insertion of an unwanted object into the receptacle 100.

The multiple receptacle contacts 130-N include multiple first contact sections 130-1S arranged on at least one surface of the receptacle tongue 120. The multiple first contact sections 130-1S extend in the direction of insertion IN of the plug 2100. When the plug 2100 is inserted into the receptacle 100, the multiple first contact sections 130-1S are electrically connected to multiple plug contacts 2130-N of the plug 2100.

The multiple first contact sections 130-1S may include a spring portion having a bent shape. In this case, when the plug 2100 is introduced into the passage 110-P of the receptacle 100, the spring portion may undergo deformation of elastic bending so as to elastically pressurize the multiple plug contacts 2130-N of the plug 2100.

The multiple first contact sections 130-1S may be divided and arranged on the upper surface 120-1S1 and the lower surface 120-1S2, which face each other, of the free end portion 120-1 of the receptacle tongue 120. In this configuration, the upper surface 120-1S1 of the free end portion 120-1 of the receptacle tongue 120 limits the upper passage 110-PU. And the lower surface 120-1S2 of the free end portion 120-1 of the receptacle tongue 120 limits the lower passage 110-PD.

The number of multiple upper first contact sections 130-1SU arranged on the upper surface 120-1S1 of the free end portion 120-1 of the receptacle tongue 120 may be equal to or different from the number of multiple lower first contact sections 130-1SD arranged on the lower surface 120-1S2 of the free end portion 120-1 of the receptacle tongue 120.

At least one of the multiple upper first contact sections 130-1SU may be used for the same function (for example, ground return path, data signal transfer, power signal transfer, etc.) as that of at least one of the multiple lower first contact sections 130-1SD.

The plug 2100 may include a multiple plug contacts 2130-N disposed on the passage 2110-P. For example, the passage 2100-P may include a first surface 2110-S1 in a first direction, and a second surface 2110-S2 in a second direction opposed to the first direction. The plug contacts 2130-N may include upper plug contacts 2130a disposed on the first surface 2110-S1, and lower plug contact 2130b disposed on the second surface 2110-S2. When the receptacle 100 and the plug 2100 are coupled with each other, the receptacle tongue 120-1 is inserted into the passage 2110-P, and the receptacle contacts 130-N on the receptacle tongue 120-1 may be electrically and respectively connected with the plug contacts 2130-N. For example, when the receptacle 100 and the plug 2100 are coupled with each other, the upper plug contacts 2130a may be respectively and electrically connected with the upper first contact sections 130-1SU, and lower plug contacts 2130b may be respectively and electrically connected with the lower first contact sections 130-1SD. Alternatively, when the plug 2100 is inverted (rotated 180°) and coupled to the receptacle 100, the low plug contacts 2130b may be respectively and electrically connected with the upper first contact sections 130-1SU, and the upper plug contacts 2130a may be respectively and electrically connected with the lower first contact sections 130-1SD.

Both the electric connection between the multiple plug contacts 2130-N of the plug 2100 and the multiple upper first contact parts 130-1SU of the receptacle 100 and the electric connection between the multiple plug contacts 2130-N of the plug 2100 and the multiple lower first contact parts 130-1SD of the receptacle 100 enable one-to-one connection between pre-designated contacts of the plug 2100 and the receptacle 100. For example, a connection may be made between a plug contact and a receptacle contact, which have been designated for a ground return path. Alternatively, a connection may be made between a plug contact and a receptacle contact, which have been designated for signal transfer. In other words, even if the plug 2100 is inserted into the receptacle 100 without distinguishing the top and bottom thereof, a correct electric connection may be established between the plug 2100 and the receptacle 100. Such a pair of plug 2100 and a receptacle 100 may be referred to as a "C-type plug", a "reversible plug", or a "reversible C-type plug" and a "C-type receptacle", a "reversible receptacle", or a "reversible C-type receptacle".

The multiple receptacle contacts 130-N include multiple second contact sections 130-2S, which extend from the multiple first contact sections 130-1S and are electrically connected at suitable locations.

The circuit board may include multiple solder pads or lands, which can be electrically connected to a large number of the multiple second contact sections 130-2S of the receptacle 100. Particularly, the multiple solder pads of the circuit board may be arranged in a row.

The multiple second contact sections 130-2S of the receptacle 100 include multiple solder tails 130-2T for the sake of soldering at suitable locations.

A large number of the multiple second contact sections 130-2S of the receptacle 100 may be connected to the multiple solder pads of the circuit board, respectively, one to one or alternatively, may be connected together to one solder pad of the circuit board.

One or more of the multiple second contact sections 130-2S of the receptacle 100 may be connected to the receptacle shell 110 and used as a ground return path.

One or more of the multiple second contact sections 130-2S of the receptacle 100 may be connected to the mid-plate 120-20 of the receptacle tongue 120 and used as a ground return path.

Figure 3:
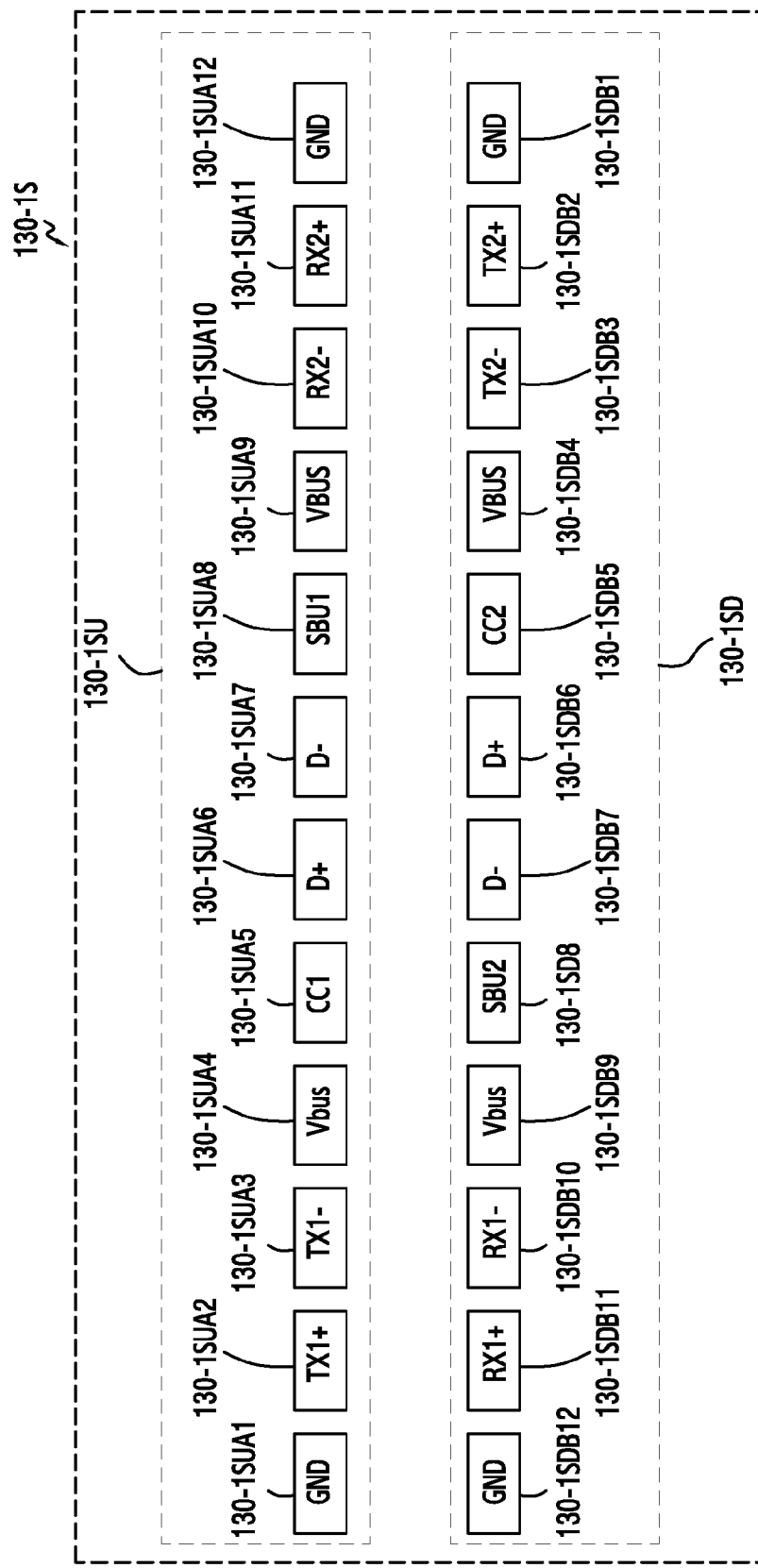
FIG. 3 schematically illustrates an arrangement of multiple receptacle contacts in connection with a receptacle tongue, according to an embodiment of the present disclosure.

FIG. 3 schematically illustrates an arrangement of multiple receptacle contacts of a receptacle tongue, according to an embodiment of the present disclosure.

Referring to FIG. 3, the multiple receptacle contacts 130-N include multiple upper first contact sections 130-1SU and multiple lower first contact sections 130-1SD arranged on opposite surfaces 120-1S1 and 120-1S2, which face each other, of the free end portion 120-1 of the receptacle tongue 120, respectively, as shown in FIGS. 1 and 2.

The number of the multiple upper first contact sections 130-1SU and the number of the multiple lower first contact sections 130-1SD may be identical. In addition, the multiple upper first contact sections 130-1SU and the multiple lower first contact sections 130-1SD may have one-to-one correspondence with each other, and the two sections 130-1SU and 130-1SD, which have one-to-one correspondence, may be set for the same functions (for example, ground return path, data signal transfer, power signal transfer, etc.).

The multiple upper first contact sections 130-1 SU are arranged according to the function, and the order of arrangement thereof may be opposite to the order of function-wise arrangement of the multiple lower first contact sections 130-1SD.

The multiple upper first contact sections 130-1SU include at least one of a first contact section 130-1SUA1 of a GND contact, a first contact section 130-1SUA2 of a TX1+ contact, a first contact section 130-1SUA3 of a TX1− contact, a first contact section 130-1SUA4 of a $V_{bus}$ contact, a first contact section 130-1SU1A5 of a CC1 contact, a first contact section 130-1SUA6 of a D+ contact, a first contact section 130-1SUA7 of a D− contact, a first contact section 130-1SUA8 of a SBU1 contact, a first contact section 130-1SUA9 of a VBUS contact, a first contact section 130-1SUA10 of a RX2− contact, a first contact section 130-1SUA11 of a RX2+ contact, and a first contact section 130-1SUA12 of a GND contact, arranged from left to right.

The multiple lower first contact sections 130-1SD include at least one of a first contact section 130-1SDB1 of a GND contact, a first contact section 130-1SDB2 of a TX2+ contact, a first contact section 130-1SDB3 of a TX2− contact, a first contact section 130-1SDB4 of a VBUS contact, a first contact section 130-1SDB5 of a CC2 contact, a first contact section 130-1SDB6 of a D+ contact, a first contact section 130-1SDB7 of a D− contact, a first contact section 130-1SDB8 of a SBU2 contact, a first contact section 130-1SDB9 of a $V_{bus}$ contact, a first contact section 130-1SDB10 of a RX1− contact, a first contact section 130-1SDB11 of a RX1+ contact, and a first contact section 130-1SDB12 of a GND contact, arranged from right to left.

In connection with the multiple upper first contact sections 130-1SU, there is arranged, between the first contact sections 130-1SUA1 and 130-1SUA12 of a pair of GND contacts for ground connection, the first contact sections 130-SUA2, 130-SUA3, 130-SUA4, 130-SUA5, 130-SUA6, 130-SUA7, 130-SUA8, 130-SUA9, 130-SUA10, and 130-SUA11 of the remaining contacts.

In connection with the multiple lower first contact sections 130-1SD, there is arranged, between the first contact sections 130-1SDB1 and 130-1SDB12 of a pair of GND contacts for ground connection, the first contact sections 130-1SDB2, 130-1SDB3, 130-1SDB4, 130-1SDB5, 130-1SDB6, 130-1SDB7, 130-1SDB8, 130-1SDB9, 130-1SDB10, and 130-1SDB11 of the remaining contacts.

The multiple receptacle contacts 130-N may include multiple receptacle contacts for supporting a communication interface (for example, USB 3.x) of an upper-level communication specification (or communication version) and multiple receptacle contacts for supporting a communication interface (for example, USB 2.x) of a lower-level communication specification, on the basis of consideration of downward compatibility. For example, the multiple receptacle contacts for solely supporting communication interface USB 2.x of the lower-level communication specification include a pair of $V_{bus}$ contacts, a SBU2 contact, a CC1 contact, a D+ contact, a D− contact, a D− contact, a D+ contact, a SBU1 contact, a CC2 contact, and a pair of VBUS contacts.

When the user device supports only a communication interface of a lower-level communication specification, the C-type receptacle 100 mounted on the user device may be configured to solely have multiple receptacle contacts for supporting a communication interface (for example, USB 2.x) of the lower-level communication specification.

Figure 4:
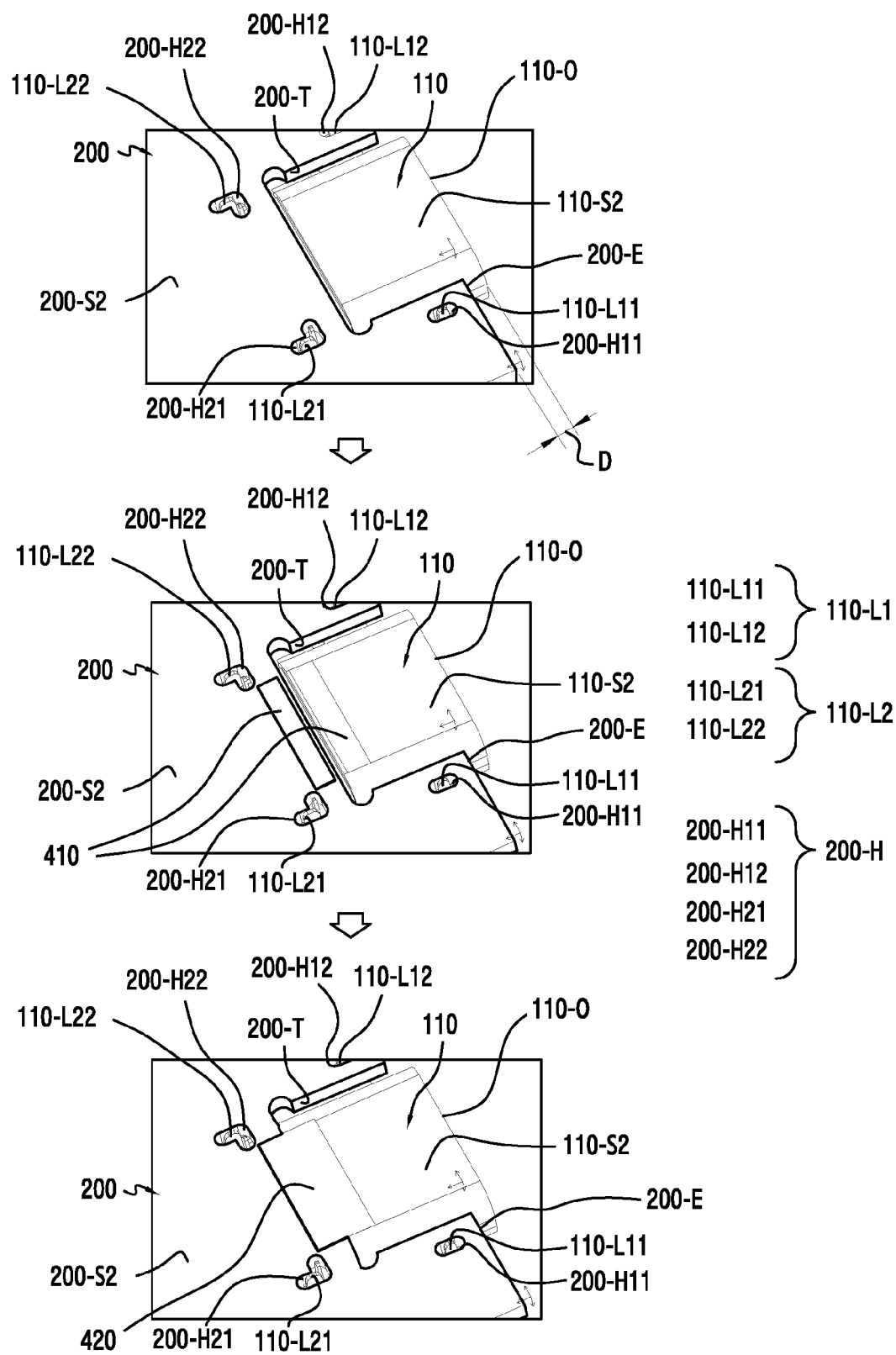
FIG. 4 illustrates coupling between a receptacle and a circuit board, according to an embodiment of the present disclosure.

FIG. 4 illustrates coupling between a receptacle and a circuit board, according to an embodiment of the present disclosure.

Referring to FIG. 4, the circuit board 200 includes a penetration portion 200-T shaped to be open towards one side thereof. The receptacle shell 110 is fitted to the penetration portion 200-T of the circuit board 200, and the bottom surface 110-S2 of the receptacle shell 110 does not protrude with regard to one surface 200-S2 of the circuit board 200. For example, the bottom surface 100-S2 of the receptacle shell 110 is flat, and is arranged at the same height as one surface 200-S2 of the circuit board 200, which is flat.

A solder paste 410 is applied to the bottom surface 110-S2 of the receptacle shell 110 and to one surface 200-S2 of the circuit board 200. Using soldering, in addition, the metal plate 420 is coupled both to the bottom surface 110-S2 of the receptacle shell 110 and to one surface 200-S2 of the circuit board 200 via the solder paste 410. The circuit board 200 and the receptacle shell 110 are thereby coupled via the metal plate 420.

The receptacle shell 110 may be metal, and is electrically connected to the circuit board 200 via the solder paste 410 and the metal plate 420. In this configuration, the receptacle shell 110 and the metal plate 420 are used as a ground return path of the circuit board 200.

The circuit board 200 includes multiple component holes or deep holes 200-H arranged around the penetration portion 200-T. Multiple leads 110-L1 and 110-L2 of the receptacle 100 are inserted into the multiple component holes 200-H of the circuit board 200, with their ends protruding to the opposite surface 200-S2 of the circuit board 200. The circuit board 200 may have a land (or copper foil pad) for soldering provided around the multiple component holes 200-H. The land may have an annular shape. And the multiple leads 110-L1 and 110-L2 may have ends coupled to the land of the circuit board 200 using soldering.

At least one lead of the receptacle 100 may be shaped to extend from a side portion of the receptacle shell 110 in the horizontal direction, and may be coupled to the corresponding land of the circuit board using soldering.

The land of the circuit board 200 is electrically connected to the ground of the circuit board 200. Therefore, the receptacle shell 110 may be used as a ground return path of the circuit board 200.

The opening 110-O of the receptacle shell 110 is directed towards the outside of the circuit board 200. The opening 110-O of the receptacle shell 110 protrudes relative to the edge 200-E of the circuit board 200, and this arrangement structure facilitates forcing the opening 100-O of the receptacle 100 against a through-hole for plug entry/exit of a frame of the user device. And the space D between the opening 110-O of the receptacle 100 and the edge 200-E of the circuit board 200 is occupied by a case frame of the user device, and the receptacle 100 can be supported by the frame of the user device.

As illustrated in FIG. 4, the receptacle 100 is installed in such a manner that a part thereof is inserted into the penetration portion 200-T of the circuit board 200, and such a manner of installing the receptacle 100 may be referred to as a "mid-mount". Compared with a structure of installing a receptacle 100 on a surface of a circuit board 200, the mid-mount installation structure can reduce the thickness of the portion of coupling between the receptacle 100 and the circuit board 200.

Figure 5:
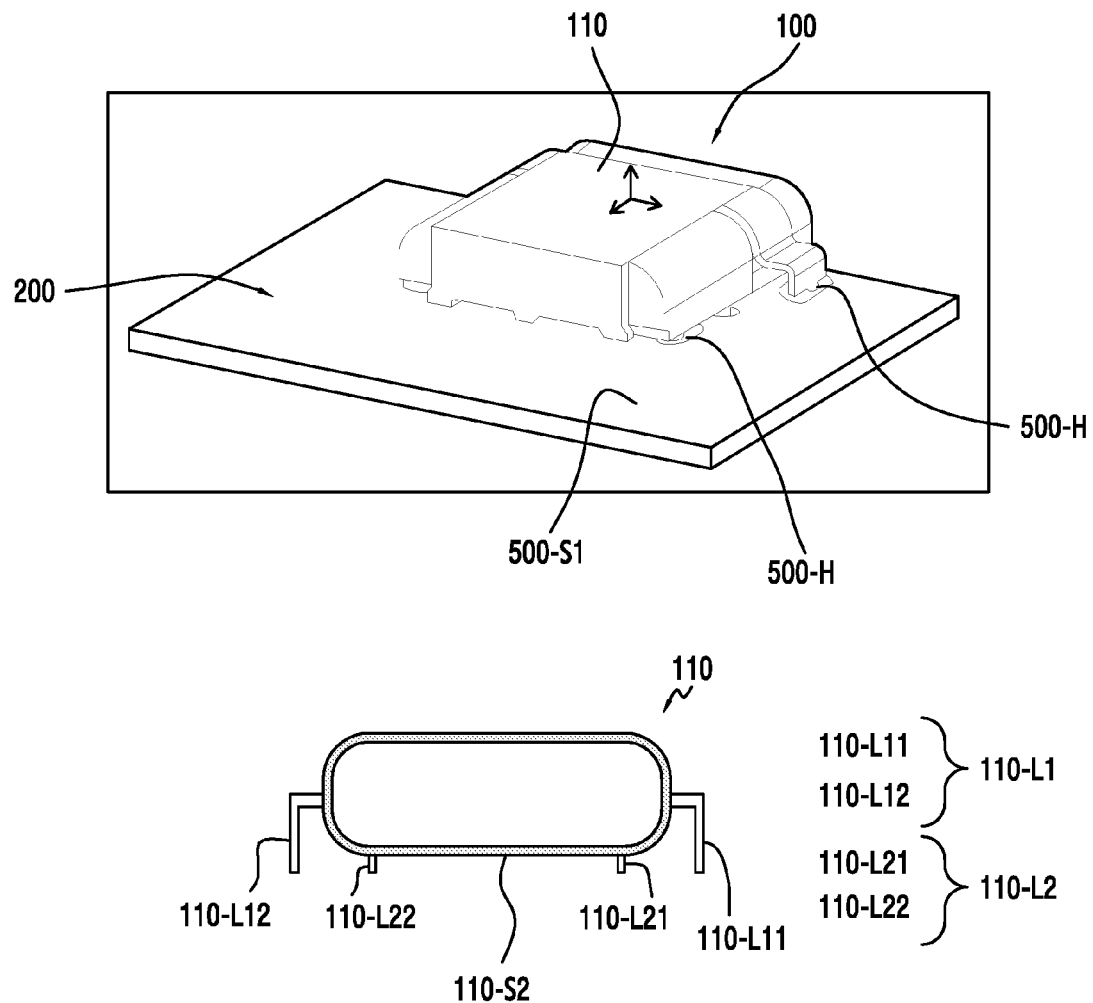
FIG. 5 illustrates coupling between a receptacle and a circuit board, according to another embodiment of the present disclosure.

FIG. 5 illustrates coupling between a receptacle and a circuit board, according to another embodiment of the present disclosure.

Referring to FIG. 5, the circuit board 500 includes multiple component holes 500-H. The bottom surface 110-S2 of the receptacle shell 110 abuts one surface 500-S1 of the circuit board 500, and multiple leads 110-L1 and 110-L2 of the receptacle 100 are inserted into the multiple component holes 500-H of the circuit board 200, respectively.

The multiple leads 110-L1 and 110-L2 of the receptacle 100 are inserted into the multiple component holes 500-H of the circuit board 500, with their ends protruding to the opposite surface 500-S2 of the circuit board 500. The circuit board 500 may have a land (or copper foil pad; not illustrated) for soldering provided around the multiple component holes 500-H. The multiple leads 110-L1 and 110-L2 may have ends coupled to the land of the circuit board 500 using soldering.

As illustrated in FIG. 5, the receptacle 100 is installed on one surface 500-S1 of the circuit board 500, and such a manner of installing the receptacle 100 may be referred to as a "top mount".

Figure 6A:
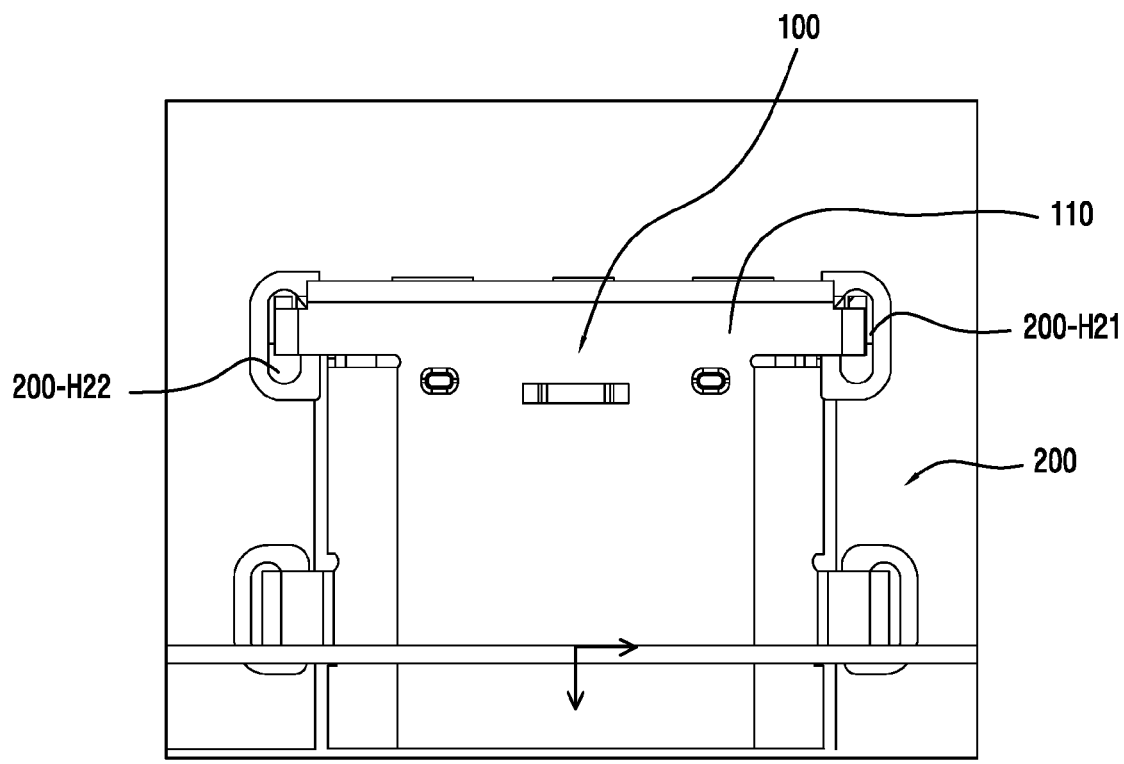
FIG. 6A illustrates a coupling state between a receptacle and a circuit board, according to an embodiment of the present disclosure.
Figure 6B:
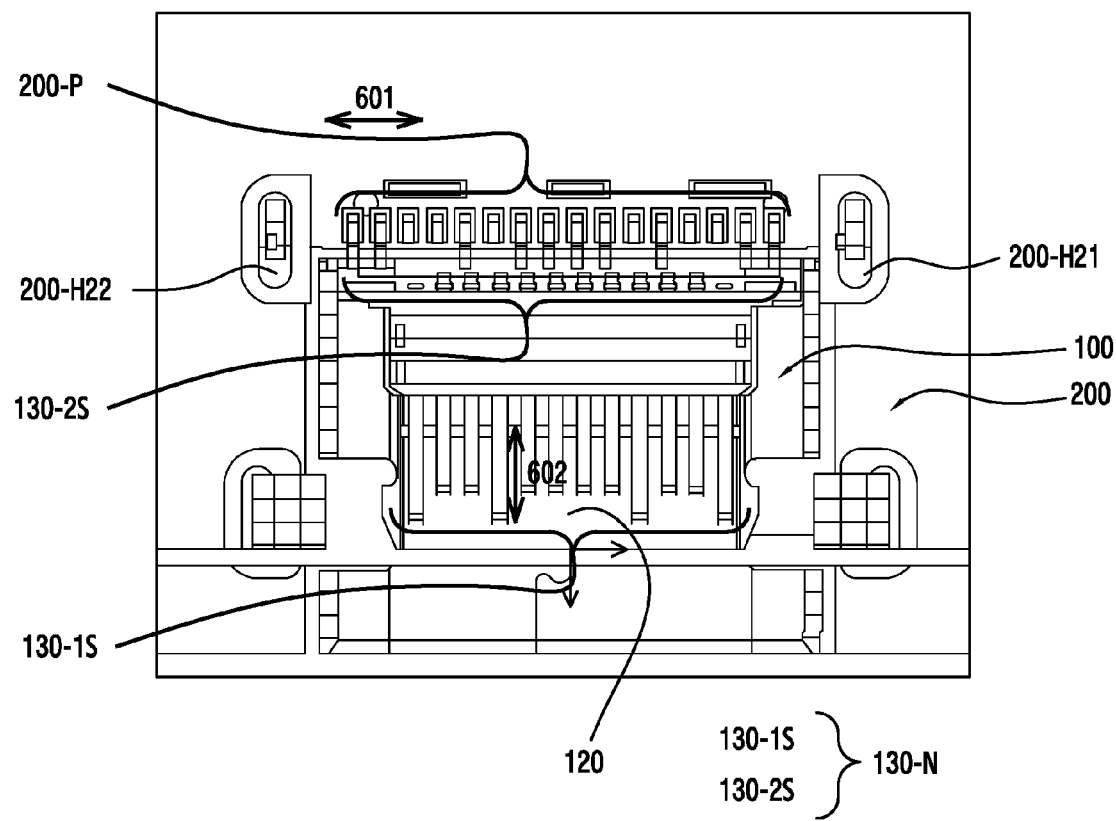
FIG. 6B illustrates a coupling state between a receptacle and a circuit board with parts of a receptacle shell removed, in order to illustrate multiple receptacle contacts, according to an embodiment of the present disclosure.
Figure 6C:
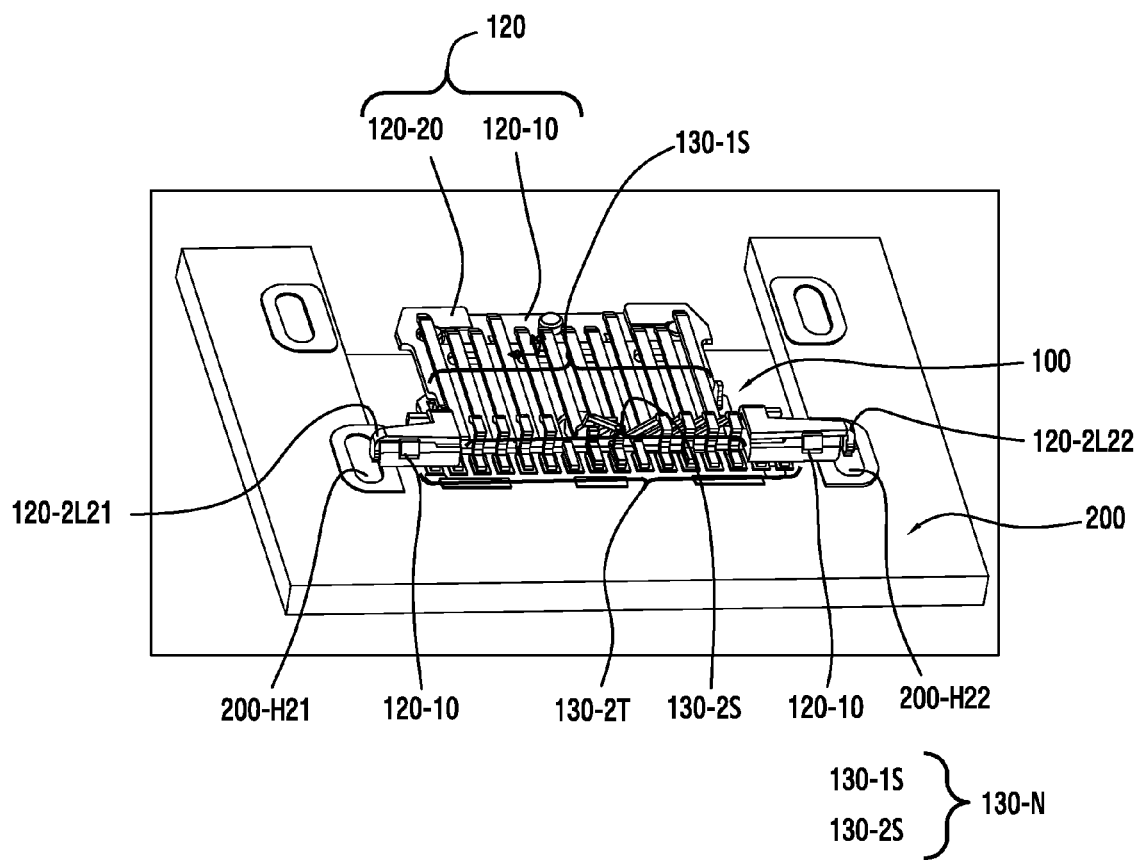
FIG. 6C illustrates a part of a coupling state between a receptacle and a circuit board, according to an embodiment of the present disclosure.

FIG. 6A illustrates a coupling state between a receptacle and a circuit board, according to an embodiment of the present disclosure. FIG. 6B illustrates a coupling state between a receptacle and a circuit board with parts of a receptacle shell removed, according to an embodiment of the present disclosure. FIG. 6C illustrates a part of a coupling state between a receptacle and a circuit board, according to an embodiment of the present disclosure.

Referring to FIG. 6A to FIG. 6C, multiple receptacle contacts 130-N of the C-type receptacle 100 include multiple first contact sections 130-1S arranged on opposite surfaces, which face each other, of the free end portion 120-1 of the receptacle tongue 120, respectively. And the multiple receptacle contacts 130-N include multiple second contact sections 120-2S, which extend from the first contact sections 130-1S and are electrically connected to the circuit board 200.

The circuit board 200 includes multiple solder pads 200-P for soldering. Particularly, the multiple solder pads 200-P may be arranged in a row.

As shown in FIG. 6B, the direction 601 of the arrangement of the multiple solder pads 200-P of the circuit board 200 may be perpendicular to the direction 602 of an extension of the multiple first contact sections 130-1S of the multiple receptacle contacts 130-N.

The multiple solder pads 200-P of the circuit board 200 are arranged between a pair of component holes 200-H21 and 200-H22.

The number of the multiple solder pads 200-P of the circuit board 200 may be equal to or smaller than the number of multiple receptacle contacts 130-N of the receptacle 100.

The multiple second contact sections 130-2S of the multiple receptacle contacts 130-N may have solder tails 130-2T for soldering. A large number of the solder tails 130-2T of the multiple second contact sections 130-2S may be coupled, one to one, to the multiple solder pads 200-P of the circuit board 200 using soldering, respectively, or may, alternatively, be coupled together to one solder pad of the circuit board 200. For example, two or more solder tails may be overlapped onto one solder pad of the circuit board 200 in the vertical direction. Alternatively, when the solder pads of the circuit board 200 have a sufficient area, two or more solder tails may be coupled to one solder pad of the circuit board 200 in parallel with each other in the horizontal direction.

The portion of coupling between the solder tails 130-2T of the multiple second contact sections 130-2S and the multiple solder pads 200-P of the circuit board 200 occurs while being covered by the receptacle shell 110.

The mid-plate 120-20 of the receptacle tongue 120 is fixed on the base plate 120-10. It is to be noted that, although the lower-side base plate 120-10 is illustrated in FIG. 6C, illustration of the other base plate that covers at least a part of the mid-plate 120-20 is omitted for convenience of description.

The mid-plate 120-20 of the receptacle tongue 120 includes a pair of leads 120-2L21 and 120-2L22. The pair of leads 120-2L21 and 120-2L22 extend towards both sides near a location between the multiple first contact sections 130-1S and the multiple second contact sections 130-2S of the multiple receptacle contacts 130-N.

The pair of leads 120-2L21 and 120-2L22 of the mid-plate 120-20 is electrically connected to a pair of components holes 200-H21 and 200-H22 of the circuit board 200.

Figure 7A:
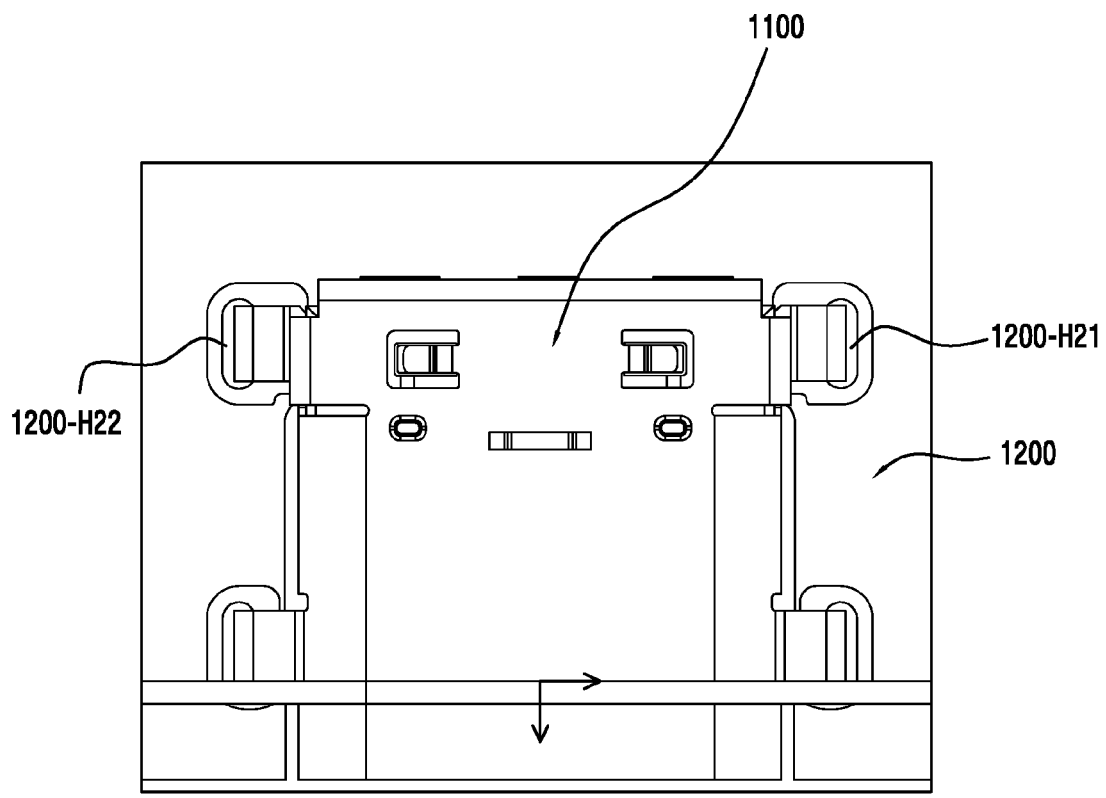
FIG. 7A illustrates a coupling state between a receptacle and a circuit board according to the prior art.
Figure 7B:
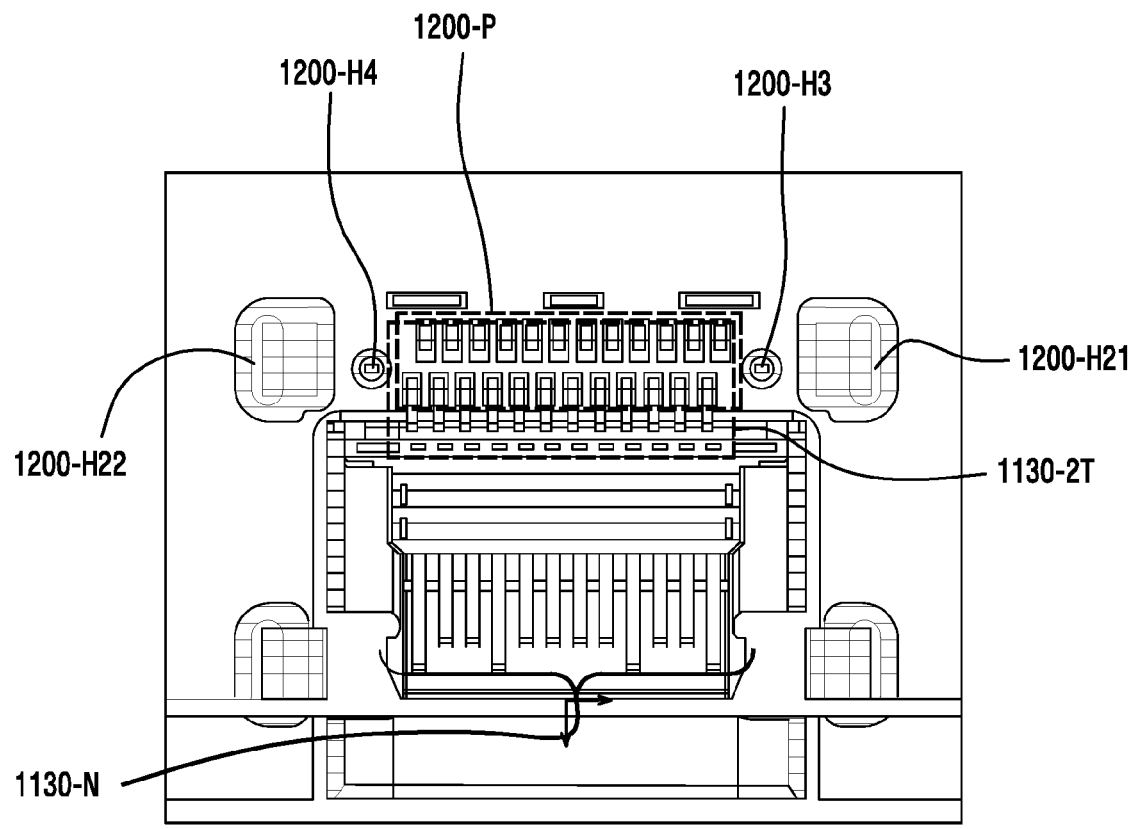
FIG. 7B illustrates a coupling state between a receptacle and a circuit board according to the prior art, with parts of a receptacle shell removed.
Figure 7C:
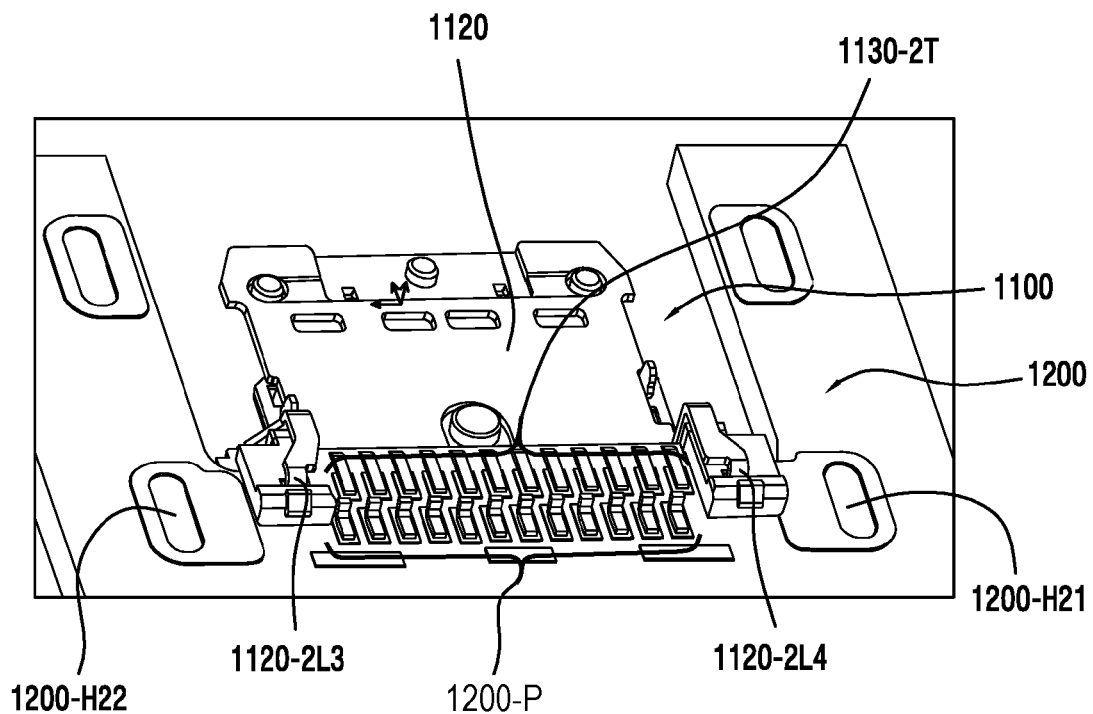
FIG. 7C illustrates a part of a coupling state between a receptacle and a circuit board according to the prior art.
Figure 7D:
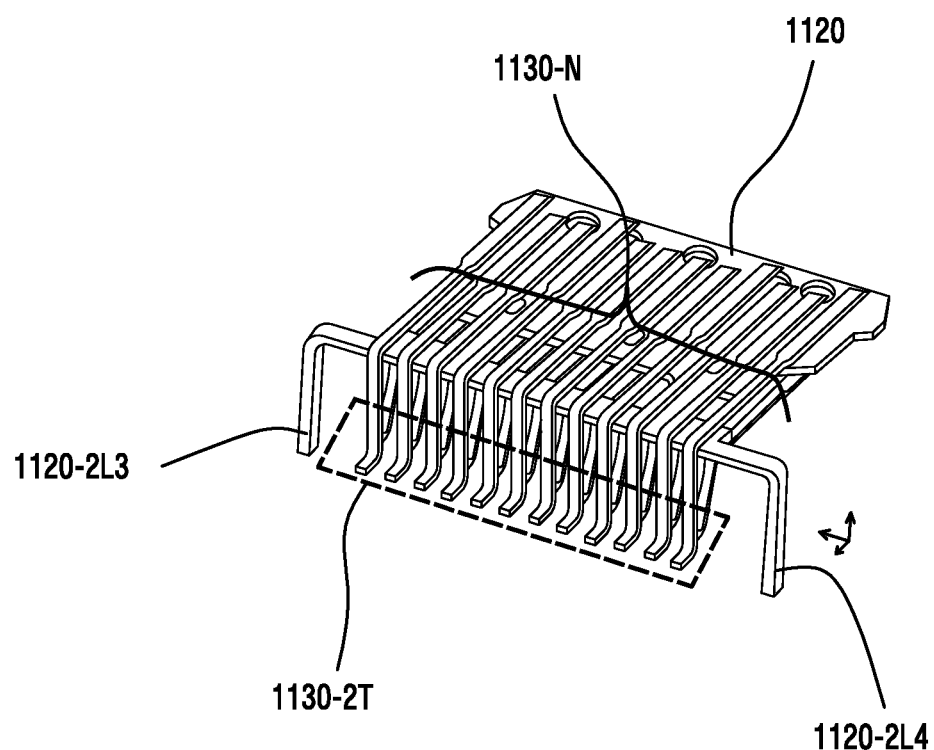
FIG. 7D illustrates a mid-plate and multiple receptacle contacts of a receptacle according to the prior art.

FIG. 7A illustrates a coupling state between a receptacle and a circuit board, according to the prior art. FIG. 7B illustrates a coupling state between a receptacle and a circuit board, according to the prior art, with parts of a receptacle shell removed. FIG. 7C illustrates a part of a coupling state between a receptacle and a circuit board, according to the prior art. FIG. 7D illustrates a mid-plate and multiple receptacle contacts of a receptacle, according to the prior art.

Referring to FIG. 7A to FIG. 7D, a receptacle 1110 and a circuit board 1200 of the prior art are provided. The receptacle 1100 includes multiple receptacle contacts 1130-N. The multiple receptacle contacts 1130-N of the receptacle 1100 include solder tails 1130-2T coupled to multiple solder pads 1200-P of the circuit board 1200 using soldering. In this configuration, the multiple solder pads 1200-P of the circuit board 1200 may be arranged in two rows. In addition, the circuit board 1200 includes a pair of ground connection component holes 1200-H3 and 1200H4, and the multiple solder pads 1200-P are arranged between the pair of ground connection component holes 1200-H3 and 1200-H4. The pair of ground connection component holes 1200-H3 and 1200-H4 is electrically connected to the ground of the circuit board 1200. Both ends 1120-2L3 and 1120-2L4 of the mid-plate 1120 of the receptacle 1100 are inserted into the pair of ground connection component holes 1200-H3 and 1200-H4 of the circuit board 1200 and then soldered, and the mid-plate 1120 is used as a ground return path of the circuit board 1200. And the pair of ground connection component holes 1200-H3 and 1200-H4 of the circuit board 1200 are arranged between another pair of receptacle coupling component holes 1200-H21 and 1200-H22 of the circuit board 1200. In this configuration, a pair of leads 1110-L21 and 1110-L22 of the receptacle 1100 are inserted into the pair of receptacle coupling component holes 1200-H21 and 1200-H22 and then soldered, and the receptacle 1100 is thereby coupled to the circuit board 1200.

Figure 8:
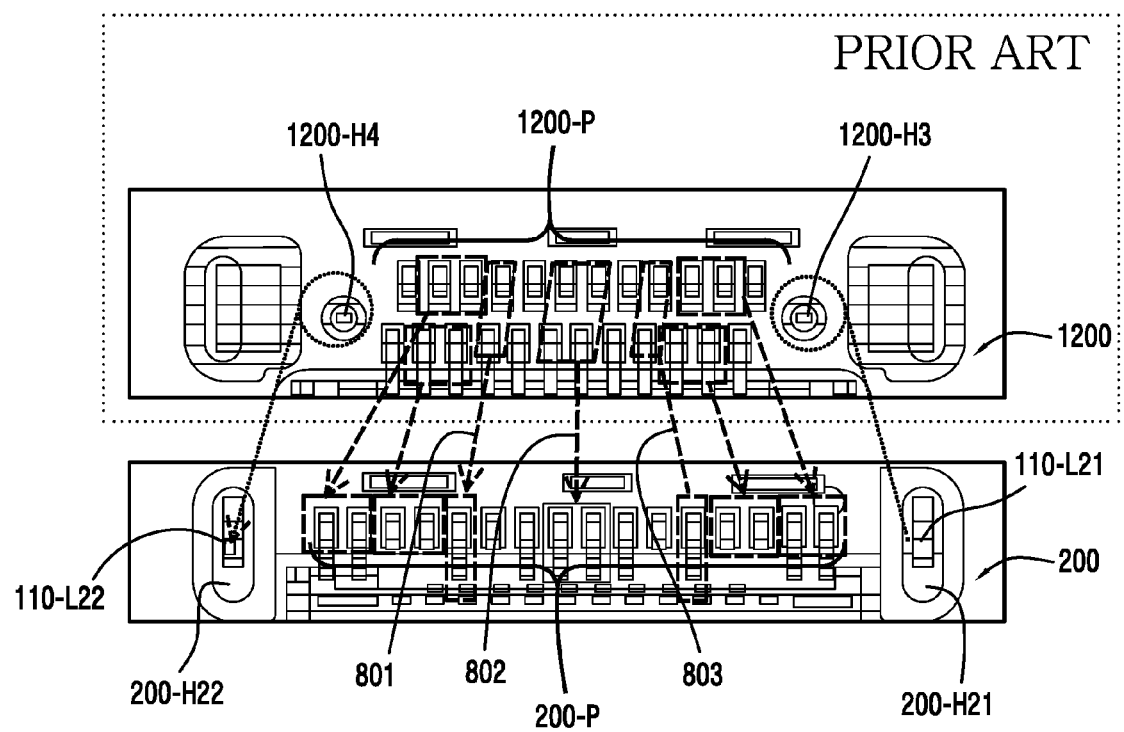
FIG. 8 is a diagram comparing a coupling state between multiple receptacle contacts and a circuit board, according to the prior art, and a coupling state between multiple receptacle contacts and a circuit board, according to an embodiment of the present disclosure.

FIG. 8 is a diagram comparing a coupling state between multiple receptacle contacts and a circuit board, according to the prior art, and a coupling state between multiple receptacle contacts and a circuit board, according to an embodiment of the present disclosure.

Referring to FIG. 8, a circuit board 1200 of the prior art and a circuit board 200 of an embodiment of the present invention are provided. According to an embodiment of the present invention, the number of multiple solder pads 200-P of the circuit board 200 is smaller than the number of solder pads 1200-P of the circuit board 1200.

One of the multiple solder pads 200-P of the circuit board 200 may be multiple pads 801, 802, and 803, which are coupled together on the circuit board 1200.

The circuit board 200 does not include a pair of ground connection component holes 1200-H3 and 1200-H4 as does the circuit board 1200, but instead uses a pair of receptacle coupling component holes 200-H21 and 200-H22 for ground connection. For example, according to an embodiment of the present invention, a pair of leads 120-2L21 and 120-2L22 (FIG. 6C) of the mid-plate 120-20 of the receptacle tongue 120 are electrically connected to the pair of receptacle coupling component holes 200-H21 and 200-H22 of the circuit board 200. Additionally, the pair of leads 110-2L21 and 110-2L22 (FIG. 3) of the receptacle shell 110 are electrically connected to the pair of components holes 200-H21 and 200-H22 of the circuit board 200. And the pair of receptacle coupling component holes 200-H21 and 200-H22 is electrically connected to the ground of the circuit board 200. Therefore, the mid-plate 120-20 of the receptacle tongue 120 may be used as a ground return path of the circuit board 200 together with the receptacle shell 110.

Compared with the circuit board 1200 of the prior art, the circuit board 200 of an embodiment of the present disclosure has a reduced number of solder pads 200-P, and thus, an area or space for additional component mounting can be secured on the circuit board 200. Furthermore, compared with the circuit board 1200 of the prior art, the circuit board 200 of an embodiment of present disclosure provides solder pads 200-P arranged in a row, further securing an area or space for additional component mounting on the circuit board 200.

Additionally, compared with the receptacle 1100 of the prior art, the mid-plate 120-20 of the receptacle tongue 120 of an embodiment of the present invention is connected to a pair of component holes 200-H12 and 200H22 of the circuit board 200, which are used to fix a pair of leads 110-L21 and 110-L22 of the receptacle shell 110 to the circuit board 200, making it unnecessary to configure separate ground connection component holes 1200-H3 and 1200-H4 on the circuit board 200. Therefore, the circuit board 200 does not include ground connection component holes 1200-H3 and 1200H4, resulting in an area or space in which additional component mounting can be secured on the circuit board 200.

Additionally, compared with the receptacle 1100 of the prior art, the receptacle 100 of an embodiment of the present invention is connected to multiple solder pads 200-P arranged in a row on the circuit board 200, thereby reducing the size of the receptacle 100. Reduction in size of the receptacle 100 secures a corresponding area or space for component mounting on the circuit board 200.

Figure 9:
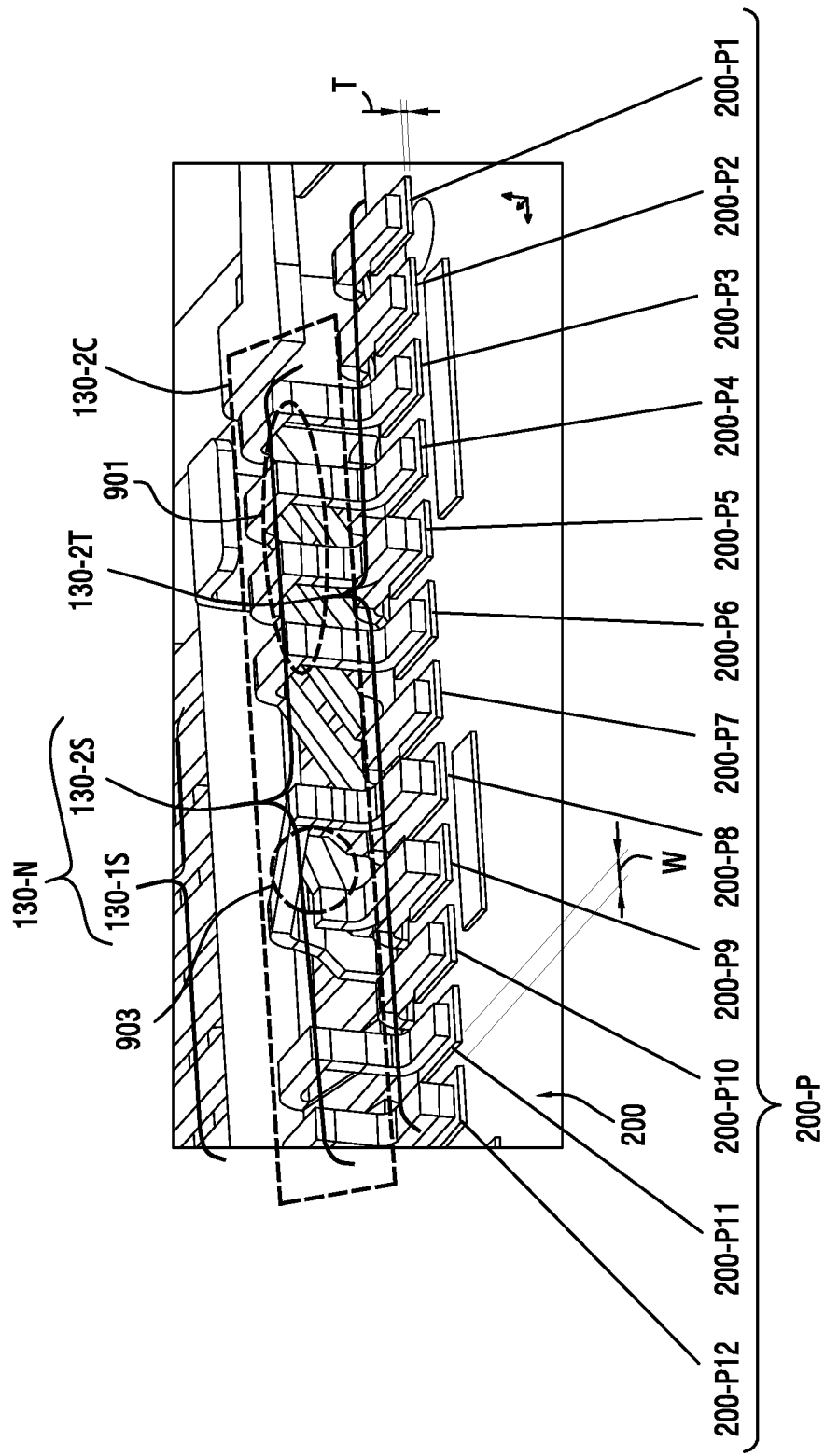
FIG. 9 illustrates a coupling state between multiple receptacle contacts and a circuit board, according to an embodiment of the present disclosure.

FIG. 9 illustrates a coupling state between multiple receptacle contacts and a circuit board, according to an embodiment of the present disclosure.

Referring to FIG. 9, the multiple solder pads 200-P of the circuit board 200 are separate from each other, and are arranged in a row.

The multiple solder pads 200-P of the circuit board 200 are each separated from each other an interval W, which may be constant or variable.

Each of the multiple solder pads 200-P of the circuit board 200 has a thickness T, which may be constant or variable.

The multiple solder pads 200-P of the circuit board 200 may have the same shape or different shapes. For example, the multiple solder pads 200-P of the circuit board 200 may be approximately quadrangular.

The multiple receptacle contacts 130-N include multiple second contact sections 130-2S, which extend from the multiple first contact sections 130-1S arranged on the receptacle tongue 120. The multiple second contact sections 130-2S include multiple solder tails 130-2T coupled to the multiple solder pads 200-P of the circuit board 200.

A solder tail 130-2T of one of the multiple second contact sections 130-2S may be coupled to one pad 200-P1, 200-P2, 200-P3, 200-P4, 200-P6, 200-P10, 200-P11, or 200-P12 of the circuit board 200.

At least two solder tails 130-2T of the multiple second contact sections 130-2S may be coupled together to one pad 200-P5, 200-P8, 200-P9, or 200-P12 of the circuit board 200. For example, the at least two solder tails 120-2T may be overlapped.

The multiple second contact sections 130-2S include connection portions 130-2C that connect between the solder tails 130-2T and the multiple first contact sections 130-1S. The connection portions 130-2C of the multiple second contact sections 130-2S may be shaped such that they do not contact each other. For example, some of the connection portions 130-2C of the multiple second contact sections 130-2S may have shapes 901 similar to each other. Alternatively, some of the connection portions 130-2C of the multiple second contact sections 130-2S may have shapes 903 so as to intersect with each other.

Figure 10:
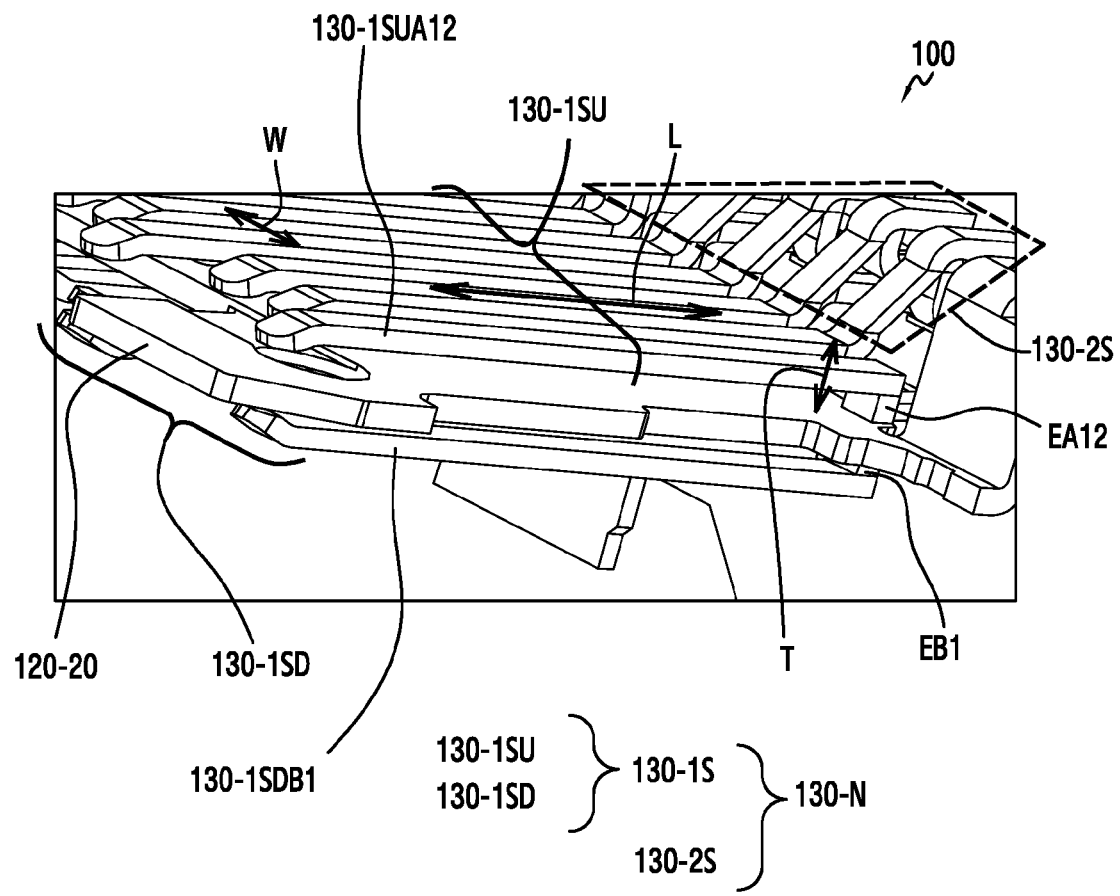
FIG. 10 illustrates a part of a receptacle, according to an embodiment of the present disclosure.

FIG. 10 illustrates a part of a receptacle, according to an embodiment of the present disclosure.

Referring FIG. 10, the receptacle 100 includes multiple receptacle contacts 130-N and a mid-plate 120-20.

The multiple receptacle contacts 130-N include, with reference to the mid-plate 120-20, multiple upper first contact sections 130-1SU arranged above the mid-plate 120-20, and multiple lower first contact sections 130-1SD arranged below the mid-plate 120-20. The multiple upper first contact sections 130-1SU and/or the multiple lower first contact sections 130-1SD have the shape of elongated plates. A length L of the multiple upper first contact sections 130-1SU and/or the multiple lower first contact sections 130-1SD may be constant or, as illustrated, may be variable. Additionally, a width W and a thickness T of the multiple upper first contact sections 130-1SU and/or the multiple lower first contact sections 130-1SD may be constant or variable. The multiple receptacle contacts 130-N include multiple second contact sections 130-2S extending from the multiple upper first sections 130-1SU and the multiple lower first contact sections 130-1SD.

At least one of the multiple upper first contact sections 130-1SU and/or the multiple lower first contact sections 130-1SD are electrically connected to the mid-plate 120-20 and used as a ground return path. For example, an end EA12 of one 130-1SUA12 of the multiple upper first contact sections 130-1SU, which is arranged on the outer side of the upper side of the mid-plate 120-20, may extend towards the mid-plate 120-20, and this end EA12 is electrically connected to the mid-plate 120-20. And, an end EB1 of one 130-1SUB1 of the multiple lower first contact sections 130-1SD, which is arranged on the outer side of the lower side of the mid-plate 120-20, may extend towards the mid-plate 120-20, and this end EB1 is electrically connected to the mid-plate 120-20.

Figure 11:
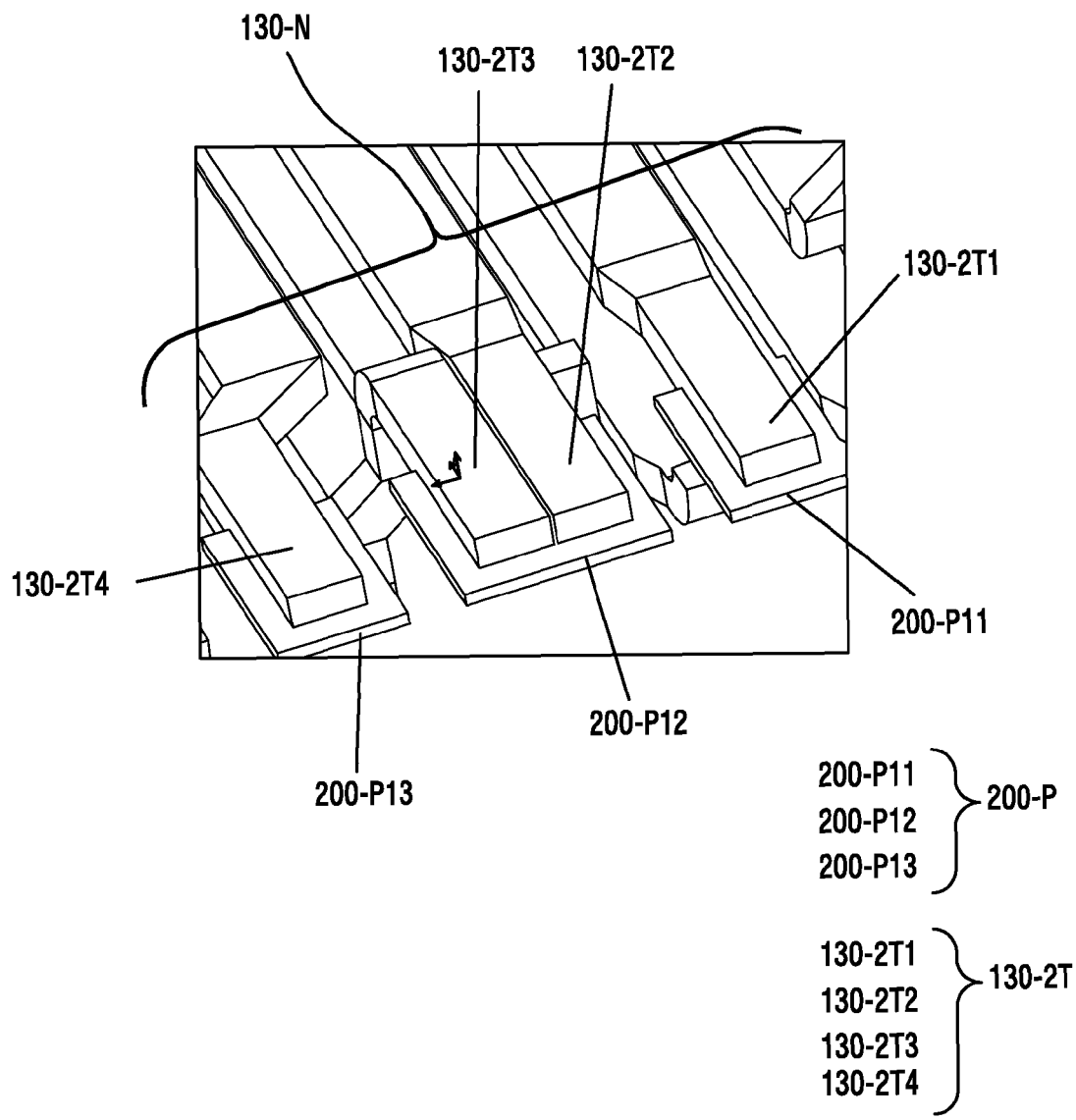
FIG. 11 illustrates a coupling state between multiple receptacle contacts and a circuit board, according to an embodiment of the present disclosure.

FIG. 11 illustrates a coupling state between multiple receptacle contacts and a circuit board, according to an embodiment of the present disclosure.

Referring to FIG. 11, the multiple solder tails 130-2T of the multiple receptacle contacts 130-N are coupled together to one solder pad 200-P of the circuit board 200. For example, the area of one solder pad 200-P12 of the circuit board 200 may be sufficient for two solder tails 130-2T2 and 130-2T3 of two receptacle contacts 130-N to be coupled thereto, and in this case, the two solder tails 130-2T2 and 130-2T3 are coupled to one solder pad 200-P12 of the circuit board 200 in parallel with each other in the horizontal direction.

Figure 12:
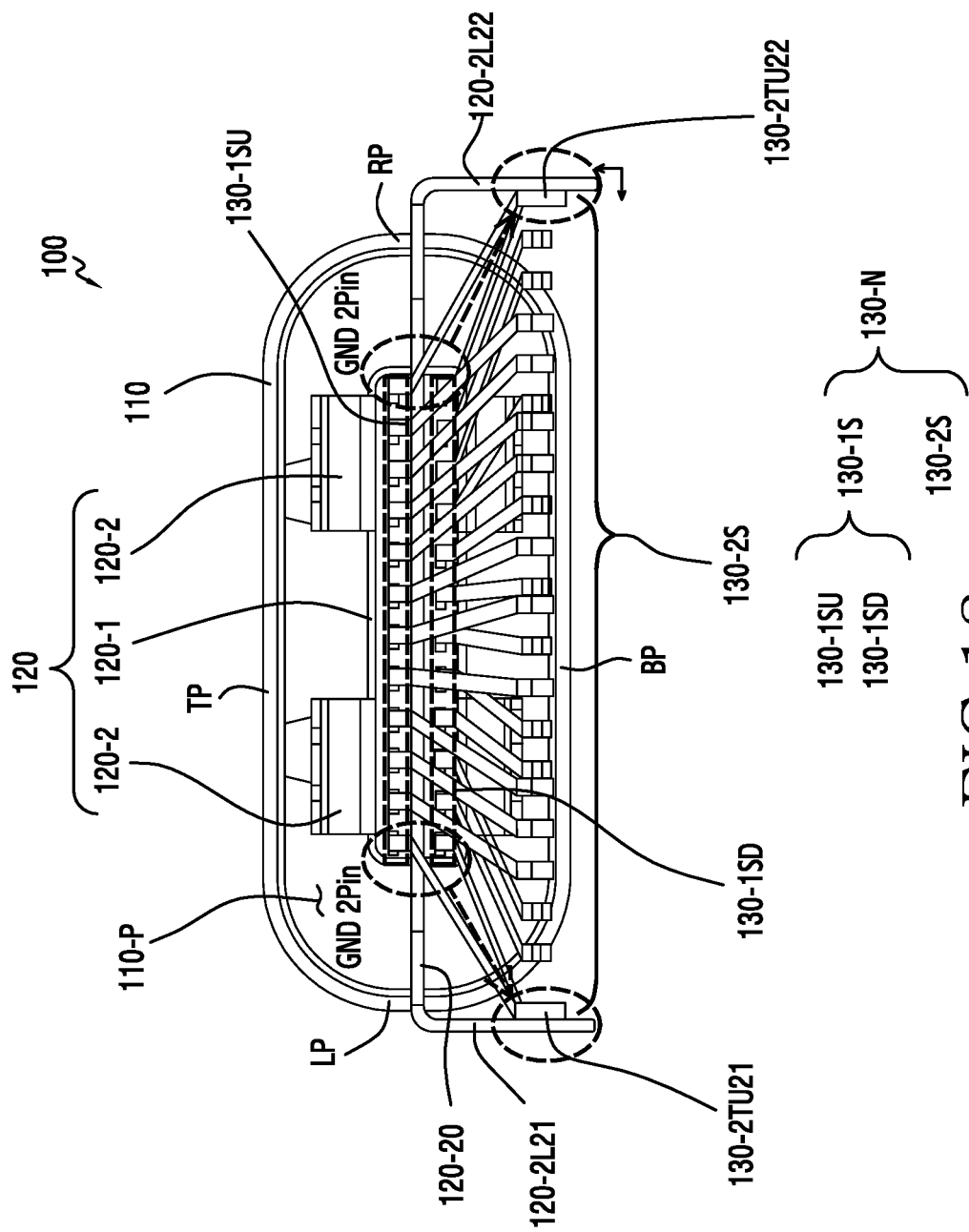
FIG. 12 is a partial sectional view of a receptacle, according to an embodiment of the present disclosure.

FIG. 12 is a partial sectional view of a receptacle, according to an embodiment of the present disclosure.

Referring to FIG. 12, the receptacle 100 includes a receptacle shell 110, a receptacle tongue 120, and multiple receptacle contacts 130-N.

The receptacle shell 110 has an annular shape having upper/lower and left/right symmetry. For example, the upper and lower portions TP and BP of the receptacle shell 110 may both be straight and parallel to one another, and the left and right portions LP and RP of the receptacle shell 110 may both be curved at the same angle.

The receptacle tongue 120 is arranged inside a passage 110-O of the receptacle shell 110. The receptacle tongue 120 includes a fixed portion 120-2, which is fixed to the inner surface of the passage 110-O of the receptacle shell 110, and a free end portion 120-1, which is connected to the fixed portion 120-2. The free end portion 120-1 does not contact the inner surface of the passage 110-O of the receptacle shell 110, and has a plate shape.

The receptacle tongue 120 includes a mid-plate 120-20. A part of the mid-plate 120-20 is arranged inside the free end portion 120-1, and another part of the mid-plate 120-20 includes a pair of leads 120-2L21 and 120-2L22 extending to opposite sides. As described above, the pair of leads 120-2L21 and 120-2L22 may be inserted into a pair of component holes 200-H21 and 200-H22 (FIG. 8) of the circuit board 200 and coupled thereto.

The multiple receptacle contacts 130-N include multiple upper first contact sections 130-1SU and multiple lower first contact sections 130-1SD, which are arranged on the free end portion 120-1 of the receptacle tongue 120. And the multiple receptacle contacts 130-N include multiple second contact sections 130-2S extending from the multiple upper first sections 130-1SU and the multiple lower first contact sections 130-1SD.

A solder tail 130-2T of a second contact section 130-2S extending from at least one of the multiple upper first contact sections 130-1SU may be connected at a suitable location and used as a ground return path.

For example, a solder tail 130-2TU21 or 130-2TU22 of a second contact section 130-2S extending from at least one of the multiple upper first contact sections 130-1SU may be electrically connected to a component hole 200-H21 or 200-H22 (FIG. 8) of the circuit board 200.

Alternatively, at least one solder tail of a second contact section 130-2S extending from at least one of the multiple upper first contact sections 130-1SU may be electrically connected to the receptacle shell 110. For example, at least one solder tail of a second contact section 130-2S extending from at least one of the multiple upper first contact sections 110-1SU may be electrically connected to a lead 110-L21 or 110-L22 of the receptacle shell 110.

Alternatively, at least one solder tail of a second contact section 130-2S extending from at least one of the multiple upper first contact sections 130-1SU may be electrically connected to the receptacle tongue 120. For example, at least one solder tail of a second contact section 130-2S extending from at least one of the multiple upper first contact sections 130-1SU may be electrically connected to the mid-plate 120-20.

The solder tail 130-2TU21 of a second contact section 130-2S extending from one of the multiple upper first contact sections 130-1SU, which is relatively arranged to the left, may be electrically connected to one of a component hole 200-H21 of the circuit board 200, the receptacle shell 110, and the mid-plate 120-20 of the receptacle tongue 120.

Additionally, a solder tail 130-2TD21 of a second contact section 130-2S extending from one of the multiple lower contact sections 130-1SD, which is relatively arranged to the left, may be electrically connected to one of a component hole 200-H21 of the circuit board 200, the receptacle shell 110, and the mid-plate 120-20 of the receptacle tongue 120.

The solder tail 130-2TU21 of a second contact section 130-2S extending from one of the multiple upper first contact sections 130-1SU, which is relatively arranged to the left, and a solder tail 130-2TD21 of a second contact section 130-2S extending from one of the multiple lower first contact sections 130-1SD, which is relatively arranged to the left, may coincide.

The solder tail 130-2TU22 of a second contact section 130-2S extending from one of the multiple upper first contact sections 130-1SU, which is relatively arranged to the right, may be electrically connected to one of a component hole 200-H22 of the circuit board 200, the receptacle shell 110, and the mid-plate 120-20 of the receptacle tongue 120.

Additionally, a solder tail 130-2TD22 of a second contact section 130-2S extending from one of the multiple lower first contact sections 130-1SD, which is relatively arranged to the right, may be electrically connected to one of a component hole 200-H22 of the circuit board 200, the receptacle shell 110, and the mid-plate 120-20 of the receptacle tongue 120.

The solder tail 130-2TU22 of a second contact section 130-2S extending from one of the multiple upper first contact sections 130-1SU, which is relatively arranged to the right, and a solder tail 130-2TD22 of a second contact section 130-2S extending from one of the multiple lower first contact sections 130-1SD, which is relatively arranged to the right, may coincide.

Figure 13:
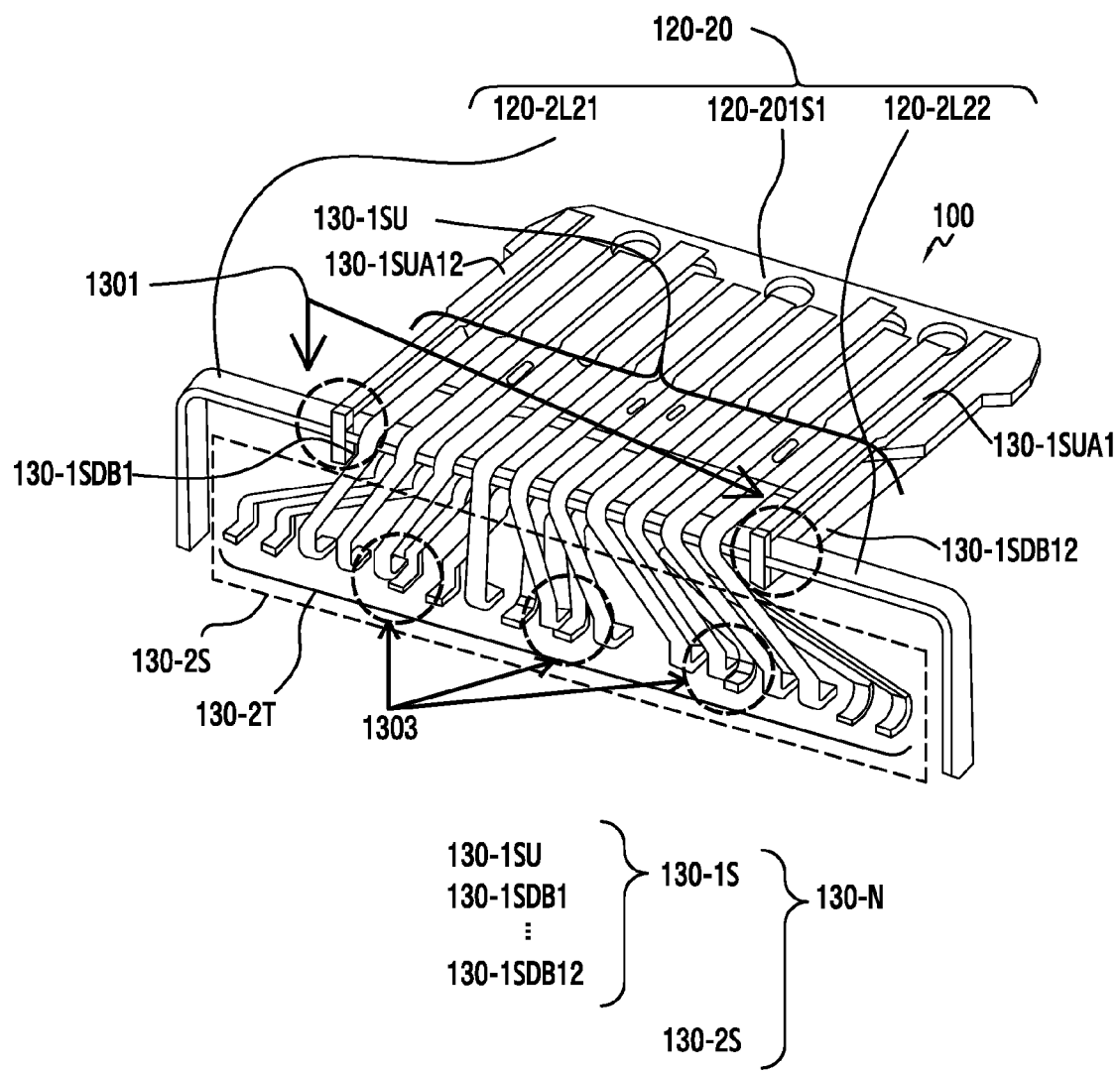
FIG. 13 and FIG. 14 illustrate parts of a receptacle, according to an embodiment of the present disclosure.
Figure 14:
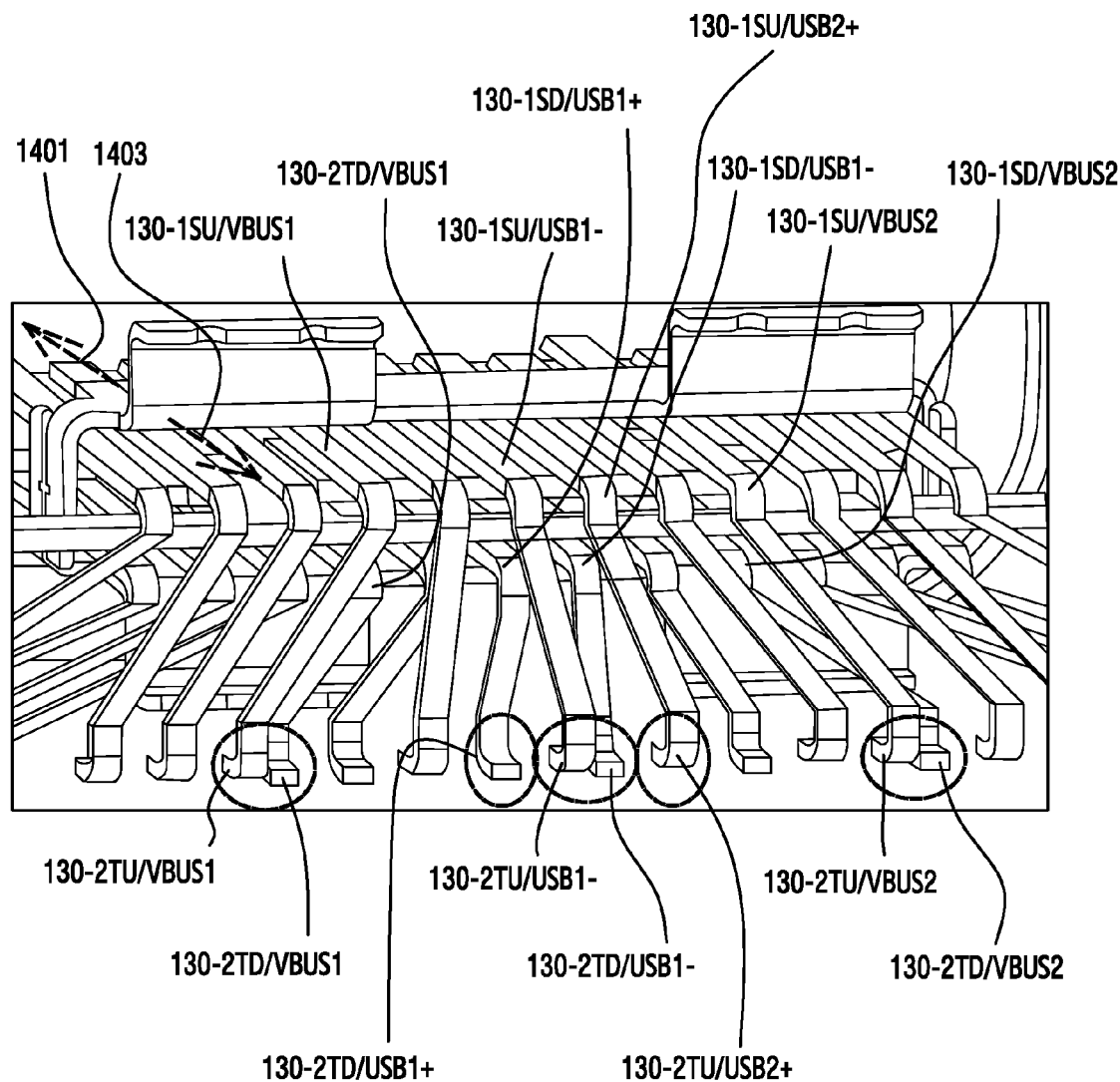

FIG. 13 and FIG. 14 illustrate parts of a receptacle, according to an embodiment of the present disclosure.

Referring to FIG. 13 and FIG. 14, the receptacle 100 includes a mid-plate 120-20 and multiple receptacle contacts 130-N.

The mid-plate 120-20 includes a first section 120-201S1, which has a plate shape, and a pair of leads 120-2L21 and 120-2L22, which extends from the first section 120-201S1 towards opposite sides.

The pair of leads 120-2L21 and 120-2L22 are plate shaped having small widths, such that they extend in the horizontal direction near a place between the multiple first contact sections 130-1S and the multiple second contact sections 130-2S of the multiple receptacle contacts 130-N and then bent in the vertical direction.

The multiple receptacle contacts 130-N include multiple upper first contact sections 130-1SU and multiple lower first contact sections 130-1SD. In this configuration, the first section 120-201S1 of the mid-plate 120-20 are arranged between the multiple upper first contact sections 130-1SU and the multiple lower first contact sections 130-1SD.

At least one of the multiple receptacle contacts 130-N is electrically connected to the mid-plate 120-20 and used as a ground return path. Ends of upper first contact sections 130-1SUA1 and 130-1SUA12 and lower first contact sections 130-1SDB1 and 130-1SDB12, which are relatively arranged on the outer side, among the multiple receptacle contacts 130-N, are electrically connected to the mid-plate 120-20 and used as a ground return path 1301.

The multiple receptacle contacts 130-N include multiple second contact sections 130-2S extending from the multiple upper first sections 130-1SU and the multiple lower first contact sections 130-1SD. And the multiple second contact sections 130-2S include multiple solder tails 130-2T that can be connected to the circuit board 200.

The multiple solder tails 130-2T are arranged in a row. And the order of arrangement of the multiple solder tails 130-2T may be diversified. For example, solder tails 130-2T of the multiple receptacle contacts 130-N for the same function may be arranged adjacent to each other 1303.

For example, as shown in FIG. 14, a solder tail 130-2TU/VBUS1, which extends from an upper first contact section 130-1SU/VBUS1, and a solder tail 130-2TD/VBUS1, which extends from a lower first contact section 130-2TD/VBUS1, may be for the purpose of a "VBUS1" function, and are arranged adjacent to each other.

For example, as shown in FIG. 14, a solder tail 130-2TU/USB1−, which extends from an upper first contact section 130-1SU/USB1−, and a solder tail 130-2TD/USB1−, which extends from a lower first contact section 130-1SD/USB1−, may be for the purpose of a "USB 1−" function, and are arranged adjacent to each other.

For example, as shown in FIG. 14, a solder tail 130-2TU/VBUS2, which extends from an upper first contact section 130-1SU/VBUS2, and a solder tail 130-2TD/VBUS2, which extends from a lower first contact section 130-1SD/VBUS2, may be for the purpose of a "VBUS2" function, and are arranged adjacent to each other.

For example, as shown in FIG. 14, a solder tail 130-2TD/USB1+, which extends from a lower first contact section 130-1SD/USB1+ assigned to a "USB1+" function, is not adjacent to other solder tails.

For example, as shown in FIG. 14, a solder tail 130-2TU/USB2+, which extends from an upper first contact section 130-1SU/USB2+ assigned to a "USB2+" function, is not adjacent to other solder tails.

For example, as shown in FIG. 14, the solder tail 130-2TU/USB1− and the solder tail 130-2TD/USB1−, which are assigned to a "USB1−" function, are adjacent to each other, and are arranged between the solder tail 130-2TD/USB1+, which is assigned to a "USB1+" function, and the solder tail 130-2TU/USB2+, which is assigned to a "USB2+" function.

The multiple solder tails 130-2T have shapes similar to those obtained by bending partial ends of multiple second contact sections 130-2S of the multiple receptacle contacts 130-N. Multiple solder tails 130-2TU, which extend from the multiple upper first contact sections 130-1SU, have shapes similar to those obtained by bending partial ends of the multiple second contact sections 130-2S towards the opening 110-O (FIG. 1) of the receptacle 100. And multiple solder tails 130-2TD, which extend from the multiple lower first contact sections 130-1SD, have shapes similar to those obtained by bending partial ends of the multiple second contact sections 130-2S so as to face away 1403 from the opening 110-O (FIG. 1) of the receptacle 100. This configuration aids in physical separation between the multiple second contact sections 130-2S, which extend from the multiple upper first contact sections 130-1SU, and the multiple second contact sections 130-2S, which extend from the multiple lower first contact sections 130-1SD.

Figure 15:
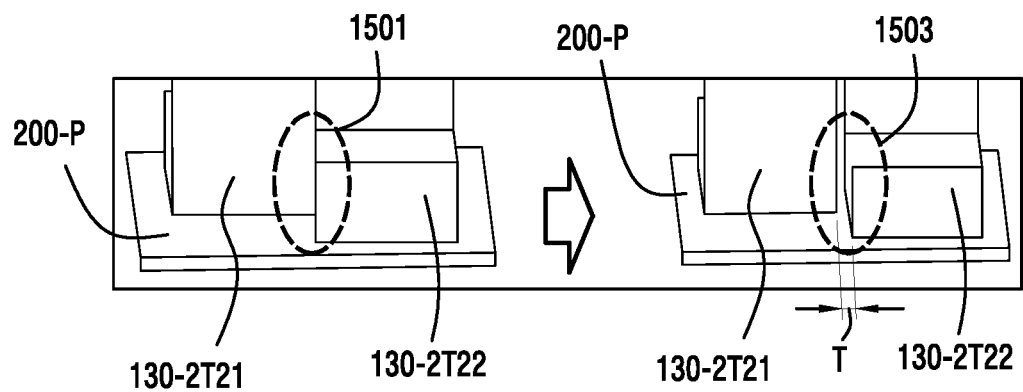
FIG. 15 illustrates an arrangement of solder tails of multiple receptacles, which are adjacent to each other, according to an embodiment of the present disclosure.

FIG. 15 illustrates an arrangement of solder tails of multiple receptacles, which are adjacent to each other, according to an embodiment of the present disclosure.

Referring to FIG. 15, solder tails 130-2T21 and 130-2T22 of multiple receptacle contacts 130-N for the same function (for example, power signal transfer, data signal transfer, etc.) are arranged adjacent to each other and soldered 1501 to solder pad P of the circuit board 200.

A narrow gap T is provided between two adjacent solder tails 130-2T because solder rising may occur during soldering. Alternatively, parts of two solder tails 130-2T may be forced against each other, while other parts are separated from each other to provide a space, which may be used to prepare against solder rising.

Figure 16:
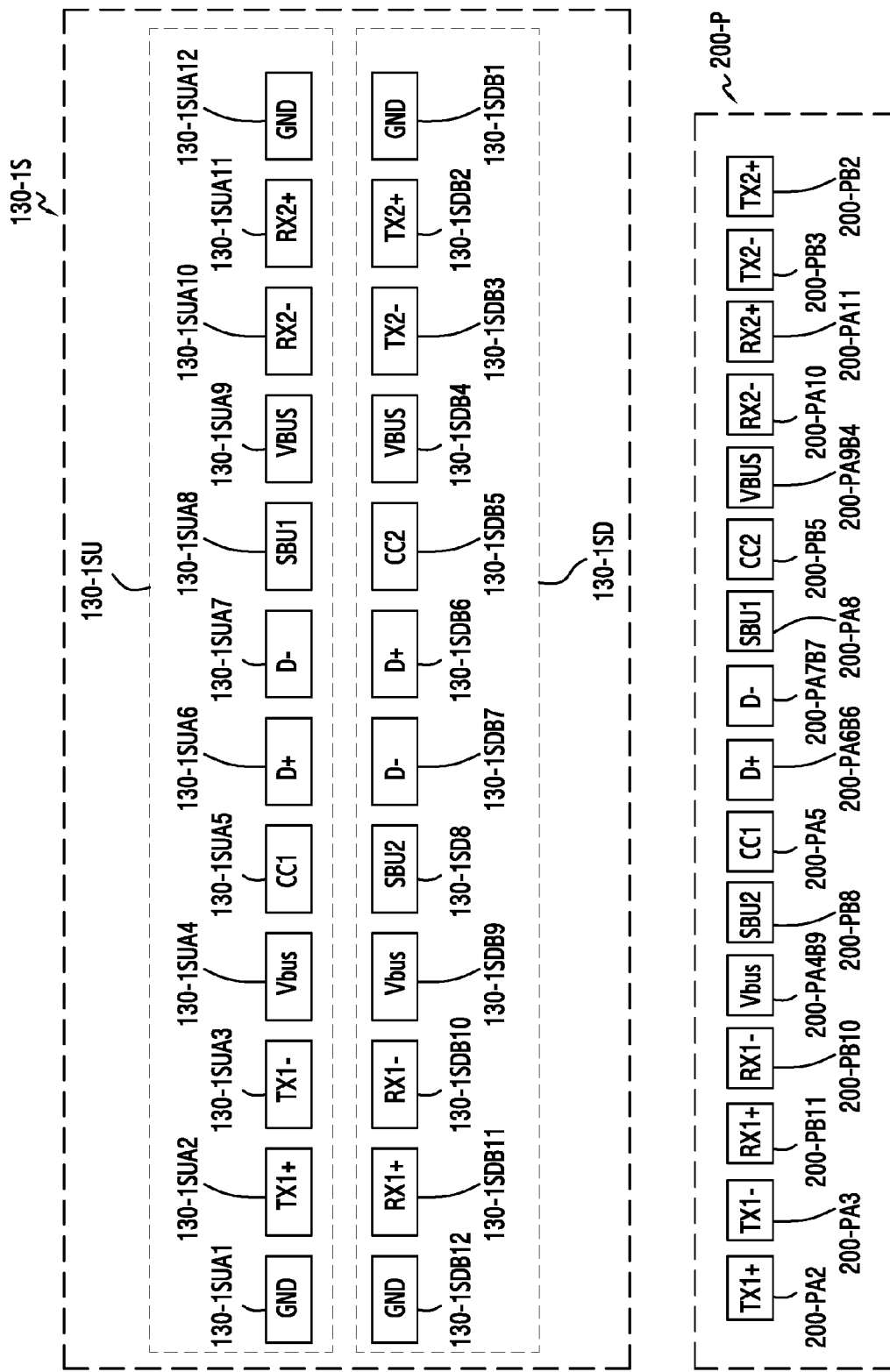
FIG. 16 illustrates an arrangement of multiple first contact sections arranged on a free end portion of a receptacle tongue in connection with multiple receptacle contacts, and an arrangement of solder pads on a circuit board, on which solder tails of multiple second contact sections extending from the multiple first contact sections are to be installed, according to an embodiment of the present disclosure.

FIG. 16 illustrates an arrangement of multiple first contact sections arranged on a free end portion of a receptacle tongue in connection with multiple receptacle contacts, and an arrangement of solder pads on a circuit board, on which solder tails of multiple second contact sections extending from the multiple first contact sections are to be installed, according to an embodiment of the present disclosure.

Referring to FIG. 16, in connection with multiple receptacle contacts 130-N, multiple first contact sections 130-1S include multiple upper first contact sections 130-1SU, which are arranged on the upper surface 1201S1 of the free end portion 1201 of the receptacle tongue 120, and multiple lower first contact sections 130-1SD, which are arranged on the lower surface 1201S2 of the free end portion 1201 of the receptacle tongue 120. For example, the multiple upper first contact sections 130-1SU may amount to twelve, and may include a first contact section 130-1SUA1 of a GND contact, a first contact section 130-1SUA2 of a TX1+ contact, a first contact section 130-1SUA3 of a TX1− contact, a first contact section 130-1SUA4 of a $V_{bus}$ contact, a first contact section 130-1SUA5 of a CC1 contact, a first contact section 130-1SUA6 of a D+ contact, a first contact section 130-1SUA7 of a D− contact, a first contact section 130-1SUA8 of a SBU1 contact, a first contact section 130-1SUA9 of a VBUS contact, a first contact section 130-1SUA10 of a RX2− contact, a first contact section 130-1SUA11 of a RX2+ contact, or a first contact section 130-1SUA12 of a GND contact. And the multiple lower first contact sections 130-SD may amount to twelve, and may include a first contact section 130-SDB1 of a GND contact, a first contact section 130-SDB2 of a TX2+ contact, a first contact section 130-SDB3 of a TX2− contact, a first contact section 130-SDB4 of a VBUS contact, a first contact section 130-SDB5 of a CC2 contact, a first contact section 130-SDB6 of a D+ contact, a first contact section 130-SDB7 of a D− contact, a first contact section 130-SDB8 of a SBU2 contact, a first contact section 130-SDB9 of a $V_{bus}$ contact, a first contact section 130-SDB10 of a RX1− contact, a first contact section 130-SDB11 of a RX1+ contact, or a first contact section 130-SDB12 of a GND contact.

Solder pads 200-P on the circuit board 200, on which solder tails 130-2T of multiple second contact sections 130-2S extending from multiple first contact sections 130-1S are to be installed, are arranged in a row.

At least one of the solder pads 200-P on the circuit board 200 may be used to install a pair of solder tails 130-2T extending from a pair of first contact sections 130-1S, which are assigned to the same function (for example, power signal transfer, data signal transfer, etc.), among multiple first contact sections 130-1S.

The number (for example, 16 or 17) of the multiple solder pads 200-P on the circuit board 200 may be smaller than the number (for example, 24) of the multiple first contact sections 130-1S of the multiple receptacle contacts 130-N.

The multiple solder pads 200-P on the circuit board 200 may amount to sixteen, and may be arranged in the following order. For example, the sixteen solder pads 200-P includes a first solder pad 200-PA2 assigned to a TX1+ contact, a second solder pad 200-PA3 assigned to a TX1− contact, a third solder pad 200-PB11 assigned to a RX1+ contact, a fourth solder pad 200-PB10 assigned to a RX1− contact, a fifth solder pad 200-PA4B9 assigned to a pair of $V_{bus}$ contacts, a sixth solder pad 200-PB8 assigned to a SBU2 contact, a seventh solder pad 200-PA5 assigned to a CC1 contact, an eighth solder pad 200-PA6B6 assigned to a pair of D+ contacts, a ninth solder pad 200-PA7B7 assigned to a pair of D− contacts, a tenth solder pad 200-PA8 assigned to a SBU1 contact, an eleventh solder pad 200-PB5 assigned to a CC2 contact, a twelfth solder pad 200-PA9B4 assigned to a pair of VBUS contacts, a thirteenth solder pad 200-PA10 assigned to a RX2− contact, a fourteenth solder pad 200-PA11 assigned to a RX2+ contact, a fifteenth solder pad 200-PB3 assigned to a TX2− contact, and a sixteenth solder pad 200-PB2 assigned to a TX2+ contact, arranged from left to right.

The order of arrangement among the first solder pad 200-PA2, the second solder pad 200-PA3, the third solder pad 200-PB11, and the fourth solder pad 200-PA4B9 may be changed. Alternatively, the order of arrangement between the sixth solder pad 200-PB6 and the seventh solder pad 200-PA5 may be changed. Alternatively, the order of arrangement between the tenth solder pad 200-PA8 and the eleventh solder pad 200-PA5 may be changed. Alternatively, the order of arrangement among the thirteenth solder pad 200-PA10, the fourteenth solder pad 200-PA11 the fifteenth solder pad 200-PB3, and the sixteenth solder pad 200-PB2 may be changed.

Figure 17:
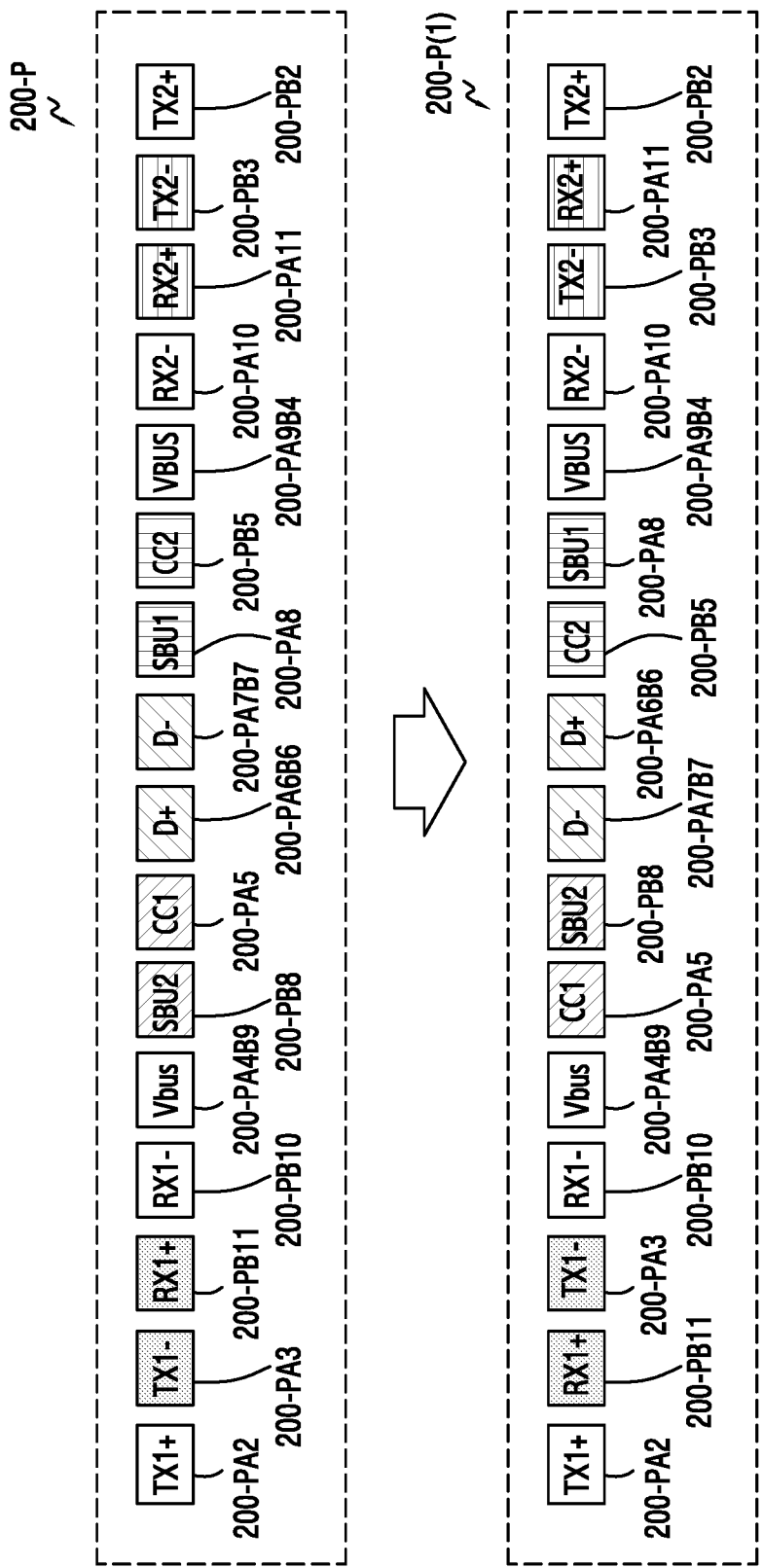
FIG. 17 illustrates changing an order of arrangement of solder pads on a circuit board, according to an embodiment of the present disclosure.

FIG. 17 illustrates changing an order of arrangement of solder pads on a circuit board, according to an embodiment of the present disclosure.

Referring to FIG. 17, the order of arrangement of solder pads board 200-P, as illustrated in FIG. 16, is changed to an order of solder pads 200-P(1). The order of arrangement between a second solder pad 200-PA3, which is assigned to a TX1− contact, and a third solder pad 200-PB11, which is assigned to a RX1+ contact, may be changed. Alternatively, the order of arrangement between a sixth solder pad 200-PB8, which is assigned to a SBU2 contact, and a seventh solder pad 200-PA5, which is assigned to a CC1 contact, may be changed. Alternatively, the order of arrangement between a third solder pad 200-PA6B6, which is assigned to a pair of D+ contacts, and a ninth solder pad 200-PA7B7, which is assigned to a pair of D− contacts, may be changed. Alternatively, the order of arrangement between a tenth solder pad 200-PA8, which is assigned to a SBU1 contact, and an eleventh solder pad 200-PB5, which is assigned to a CC2 contact, may be changed. Alternatively, the order of arrangement between a fourteenth solder pad 200-PA11 which is assigned to a RX2+ contact, and a fifteenth solder pad 200-PA3, which is assigned to a TX2− contact, may be changed.

Figure 18:
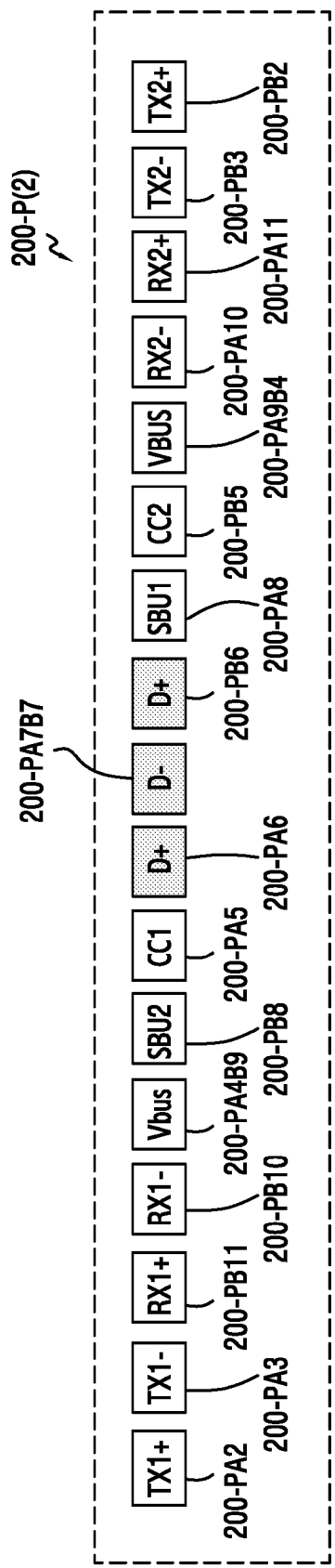
FIG. 18 illustrates an arrangement of solder pads on a circuit board, on which solder tails of multiple second contact sections are to be installed, in connection with receptacle contacts, according to an embodiment of the present disclosure.

FIG. 18 illustrates an arrangement of solder pads on a circuit board, on which solder tails of multiple second contact sections are to be installed, in connection with receptacle contacts, according to an embodiment of the present disclosure.

Referring to FIG. 18, an arrangement of solder pads 200-P(2) is provided. The solder pads 200-P(2) on the circuit board 200 may amount to seventeen, and may be arranged in the following order. For example, the seventeen solder pads 200-P(2) include a first solder pad 200-PA2 assigned to a TX1+ contact, a second solder pad 200-PA3 assigned to a TX1− contact, a third solder pad 200-PB11 assigned to a RX1+ contact, a fourth solder pad 200-P10 assigned to a RX1− contact, a fifth solder pad 200-PA4B9 assigned to a pair of $V_{bus}$ contacts, a sixth solder pad 200-PB8 assigned to a SBU2 contact, a seventh solder pad 200-PA5 assigned to a CC1 contact, an eighth solder pad 200-PA6 assigned to a D+ contact, a ninth solder pad 200-PA7B7 assigned to a pair of D−contacts, a tenth solder pad 200-PB6 assigned to a D+ contact, an eleventh solder pad 200-PA8 assigned to a SBU1 contact, a twelfth solder pad 200-PB5 assigned to a CC2 contact, a thirteenth solder pad 200-PA9B4 assigned to a pair of VBUS contacts, a fourteenth solder pad 200-PA10 assigned to a RX2− contact, a fifteenth solder pad 200-PA11 assigned to a RX2+ contact, a sixteenth solder pad 200-PB3 assigned to a TX2-contact, and a seventeenth solder pad 200-PB2 assigned to a TX2+ contact, arranged from left to right.

Figure 19:
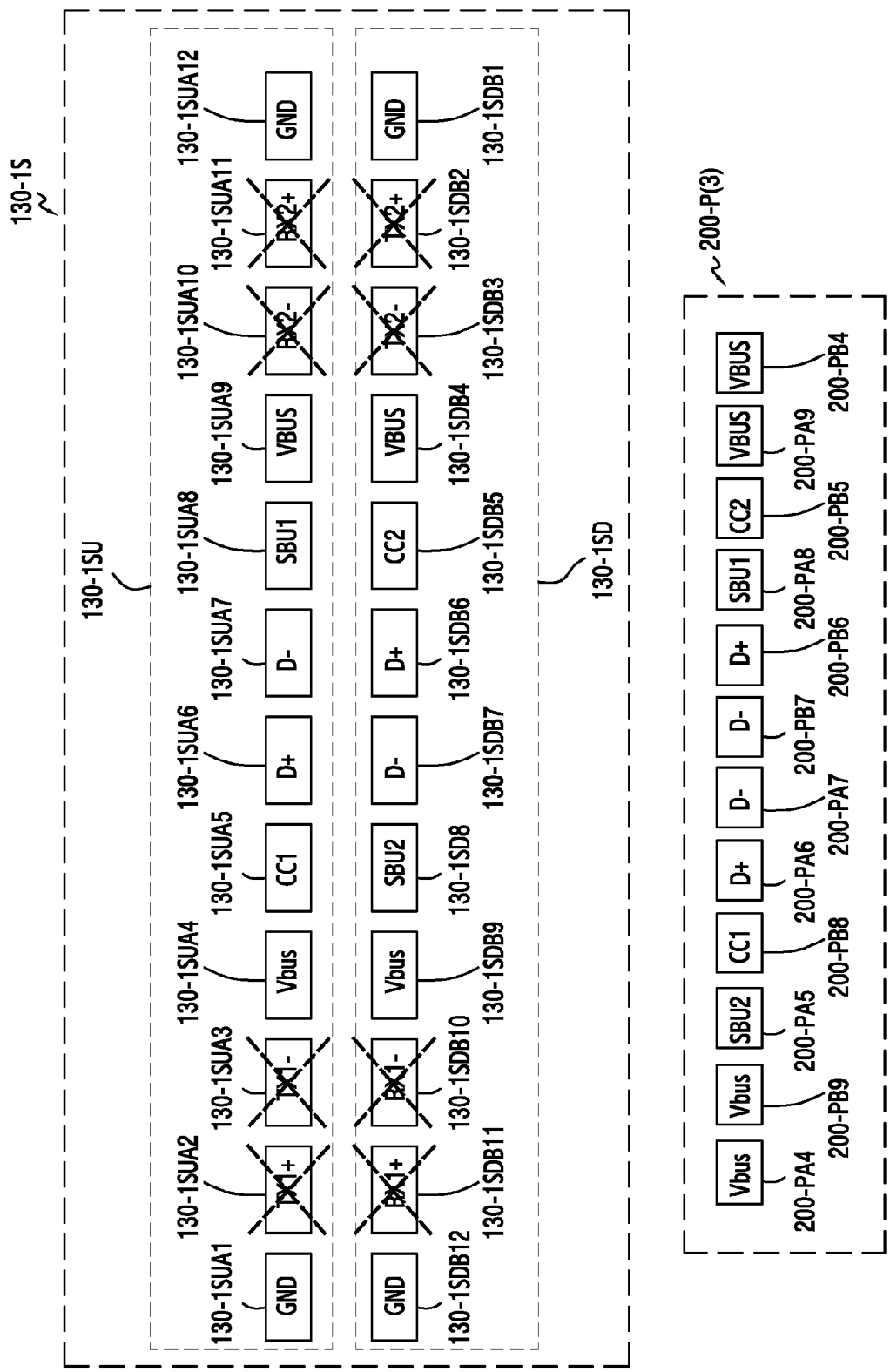
FIG. 19 illustrates an arrangement of multiple first contact sections arranged on a free end portion of a receptacle tongue in connection with multiple receptacle contacts, and an arrangement of solder pads on a circuit board, on which solder tails of multiple second contact sections extending from the multiple first contact sections are to be installed, according to an embodiment of the present disclosure.

FIG. 19 illustrates an arrangement of multiple first contact sections arranged on a free end portion of a receptacle tongue in connection with multiple receptacle contacts, and an arrangement of solder pads on a circuit board, on which solder tails of multiple second contact sections extending from the multiple first contact sections are to be installed, according to an embodiment of the present disclosure.

Referring to FIG. 19, an arrangement of multiple first contact sections 200-P(3) arranged on a free end portion of a receptacle tongue in connection with multiple receptacle contacts 130-N is provided. The multiple receptacle contacts 130-N of the C-type receptacle 100 mounted on the user device includes multiple receptacle contacts for supporting a communication interface (for example, USB 3.x) of an upper-level communication specification and multiple receptacle contacts for supporting a communication interface (for example, USB 2.x) of a lower-level communication specification, on the basis of consideration of downward compatibility. For example, the multiple receptacle contacts 130-N for solely supporting communication interface USB 2.x of the lower-level communication specification may include a pair of $V_{bus}$ contacts, a SBU2 contact, a CC1 contact, a D+ contact, a D− contact, a D− contact, a D+ contact, a SBU1 contact, a CC2 contact, and a pair of VBUS contacts.

When the user device supports only a communication interface of a lower-level communication specification, the C-type receptacle 100 mounted on the user device may be configured to solely have multiple receptacle contacts 130-N for supporting a communication interface (for example, USB 2.x) of the lower-level communication specification.

Alternatively, when the user device supports only a communication interface of a lower-level communication specification, the C-type receptacle 100 mounted on the user device may be configured to solely have multiple receptacle contacts 130-N for supporting a communication interface (for example, USB 2.x) of the lower-level communication specification, and multiple receptacle contacts for supporting the communication interface (for example, USB 3.x) of the upper-level communication specification may be removed. Therefore, multiple first contact sections of the removed multiple receptacle contacts 130-N are not be arranged on the free end portion of the receptacle tongue. For example, among the multiple upper first contact sections 130-1SU of the multiple receptacle contacts 130-N, illustrated in FIG. 16, the first contact section 130-1SUA2 of the TX1+ contact, the first contact section 130-1SUA3 of the TX1− contact, the first contact section 130-1SUA10 of the RX2− contact, and the first contact section 130-1SUA11 of the RX2+ contact may be removed. Furthermore, among the multiple lower first contact sections 130-1SD of the multiple receptacle contacts 130-N, illustrated in FIG. 16, the first contact section 130-SDB2 of the TX2+ contact, the first contact section 130-SDB3 of the TX2− contact, the first contact section 130-SDB10 of the RX1− contact, and the first contact section 130-SDB11 of the RX1+ contact may be removed. And, after the multiple receptacle contacts 130-N for supporting the communication interface of the upper-level communication specification are removed, the remaining multiple receptacle contacts 130-N may be arranged variously on the basis of consideration of the C-type receptacle.

Solder pads 200-P on the circuit board 200, on which solder tails 130-2T of multiple second contact sections 130-2S extending from multiple first contact sections 130-1S are to be installed, are solely for the purpose of supporting a communication interface (USB 2.x) of the lower-level communication specification, and may be arranged in a row in various orders. For example, the solder pads 200-P of the circuit board 200 may amount to twelve, and may include a first solder pad 200-PA4 assigned to a $V_{bus}$ contact, a second solder pad 200-PB9 assigned to a Vbus contact, a third solder pad 200-PA5 assigned to a SBU2 contact, a fourth solder pad 200-PB8 assigned to a CC1 contact, a fifth solder pad 200-PA6 assigned to a D+ contact, a sixth solder pad 200-PA7 assigned to a D− contact, a seventh solder pad 200-PB7 assigned to a D− contact, an eighth solder pad 200-PB6 assigned to a D+ contact, a ninth solder pad 200-PA8 assigned to a SBU1 contact, a tenth solder pad 200-PB5 assigned to a CC2 contact, an eleventh solder pad 200-PA9 assigned to VBUS contact, and a twelfth solder pad 200-PB4 assigned to a VBUS contact, arranged from left to right.

Figure 20:
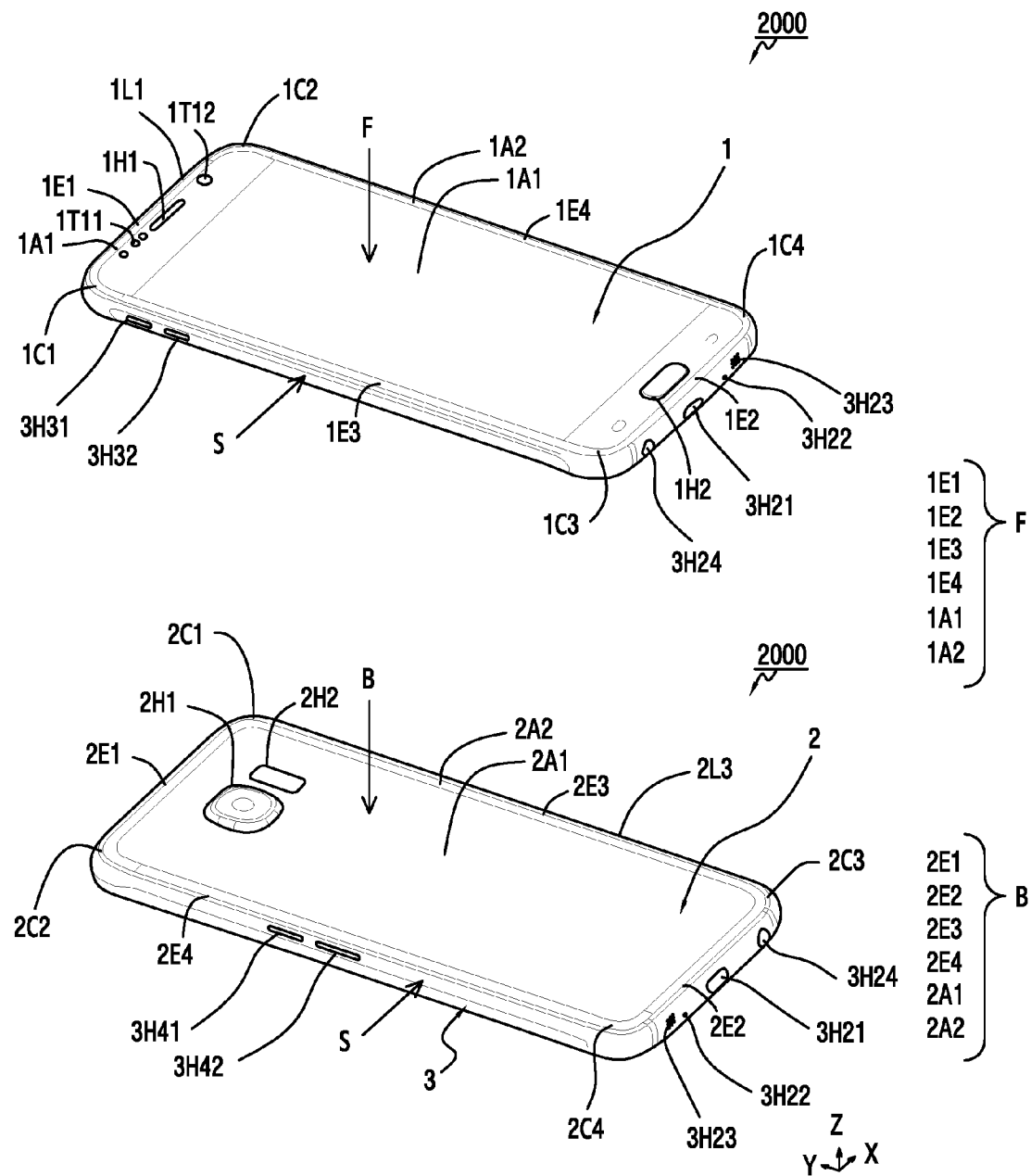
FIG. 20 is a perspective view of an electronic device, according to an embodiment of the present disclosure.

FIG. 20 is a perspective view of an electronic device, according to an embodiment of the present disclosure. And FIG. 21 is a perspective view of an electronic device viewed in various directions, according to an embodiment of the present disclosure.

Figure 21:
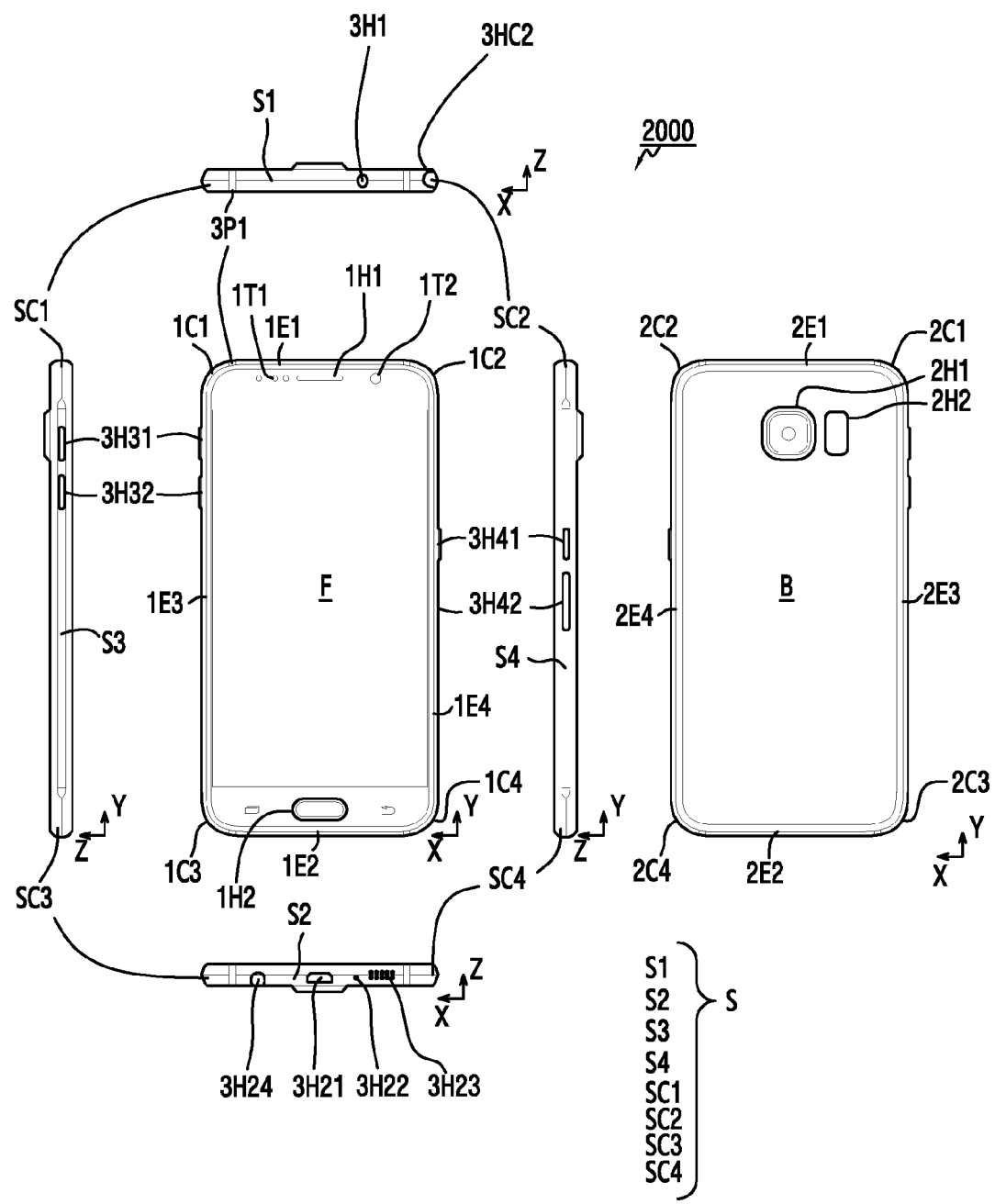
FIG. 21 is a perspective view of an electronic device viewed in various directions, according to an embodiment of the present disclosure.

Referring to FIG. 20 and FIG. 21, electronic device 2000 includes a front cover 1, which is approximately shaped as a quadrangular rectangle, and which forms the front F of the electronic device 2000, and a back cover 2, which forms the back B of the electronic device 2000. In addition, the electronic device 2000 includes a bezel 3 which surround the space between the front cover 1 and the back cover 2. In addition, the electronic device 2000 includes a display device contained in the space formed by the front cover 1 and the back cover 2. In this configuration, the screen area of the display device exposed to the outside via the front cover 1.

The front cover 1 and/or the back cover 2 may be made of glass.

The bezel 3 may be made of a non-metallic material or a metal.

The front F includes a first edge 1E1, a second edge 1E2, a third edge 1E3, and a fourth edge 1E4. The first edge 1E1 and the second edge 1E2 are arranged on opposite sides, and the third edge 1E3 and the fourth edge 1E4 are arranged on the opposite sides. The third edge 1E3 connects one end of the first edge 1E1 and one end of the second edge 1E2. And the fourth edge 1E4 connects the other end of the first edge 1E1 and the other end of the second edge 1E2.

The first edge 1E1, the second edge 1E2, the third edge 1E3, or the fourth edge 1E4 may be straight, as illustrated, or may be curved, without being limited thereto.

The front F includes a first corner edge 1C1 to which the first edge 1E1 and the third edge 1E3 are connected. The front F includes a second corner edge 1C2 to which the first edge 1E1 and the fourth edge 1E4 are connected. The front F includes a third corner edge 1C3 to which the second edge 1E2 and the third edge 1E3 are connected. And the front F includes a fourth corner edge 1C4 to which the second edge 1E2 and the fourth edge 1E4 are connected.

The front F includes a center area 1A1 which approximately coincides with the screen area of the display device. The center area 1A1 may be planar or curved. And the center area 1A1 may be approximately quadrangular in shape, and may be transparent such that images on the screen area of the display device are visible to the outside.

The front F includes an edge area 1A2 which surround the center area 1A1. The edge area 1A2 may have an approximately quadrangular, annular shape. And the edge area 1A2 may exhibit a color. For example, the edge area 1A2 may exhibit a color similar to or different from that of the bezel 3.

The front cover 1 includes a through-hole 1H1 for supporting a speaker or a receiver mounted on the electronic device 2000. Sound from the speaker or the receiver is discharged to the outside via the through-hole 1H1.

The front cover 1 includes at least one transparent area 1T11 and 1T12 for supporting an optical component (for example, a luminance sensor, an image sensor, etc.) mounted on the electronic device 2000. External light is introduced to the optical component via the transparent areas 1T11 and 1T12.

The front cover 1 includes a through-hole 1H2 for supporting a button mounted on the electronic device 2000. The button is exposed to the outside via the through-hole 1H2.

According to an embodiment of the present disclosure, the back B includes a first edge 2E1, a second edge 2E2, a third edge 2E3, and a fourth edge 2E4. The first edge 2E1 and the second edge 2E2 are arranged on opposite sides, and the third edge 2E3 and the fourth edge 2E4 are arranged on the opposite sides. The third edge 2E3 connects one end of the first edge 2E1 and one end of the second edge 2E2. And the fourth edge 2E4 connects the other end of the first edge 2E1 and the other end of the second edge 2E2.

The first edge 2E1, the second edge 2E2, the third edge 2E3, or the fourth edge 2E4 may be straight, as illustrated, or may be curved, without being limited thereto.

The back B includes a first corner edge 2C1 to which the first edge 2E1 and the third edge 2E3 are connected. The back B includes a second corner edge 2C2 to which the first edge 2E1 and the fourth edge 2E4 are connected. The back B includes a third corner edge 2C3 to which the second edge 2E2 and the third edge 2E3 are connected. And the back B includes a fourth corner edge 2C4 to which the second edge 2E2 and the fourth edge 2E4 are connected.

The back B includes a center area 2A1 and an edge area 2A2 which surround the center area 2A1. The center area 2A1 may be approximately quadrangular in shape, and includes a planar surface or a curved surface. And the edge area 2A2 may have an approximately quadrangular, annular shape. The edge area 2A2 includes a curved surface.

The back B may exhibit a color. For example, the back B may exhibit a color similar to or different from that of the bezel 3.

The back cover 2 includes a through-hole 2H1 for a camera mounted on the electronic device 2000. The camera is exposed to the outside via the through-hole 2H1. And the back cover 2 includes a through-hole or a transparent area 2H2 for a flash mounted on the electronic device 2000. Light from the flash is discharged to the outside via the through-hole or the transparent area 2H2.

The bezel 3 forms the side S of the electronic device 2000. For example, the side S includes a first connection surface S1 to which the first edge 1E1 of the front F and the first edge 2E1 of the back B are connected. The side S includes a second connection surface S2 to which the second edge 1E2 of the front F and the second edge 2E2 of the back B are connected. The side S includes a third connection surface S3 to which the third edge 1E3 of the front F and the third edge 2E3 of the back B are connected. And the side S includes a fourth connection surface S4 to which the fourth edge 1E4 of the front F and the fourth edge 2E4 of the back B are connected.

The bezel 3 includes a first connection surface SC1 to which the first corner edge 1C1 of the front F and the first corner edge 2C1 of the back B are connected. The bezel 3 includes a second connection surface S2 to which the second corner edge 1C2 of the front F and the second corner edge 2C2 of the back B are connected. The bezel 3 includes a third connection surface S3 to which the third corner edge 1C3 of the front F and the third corner edge 2C3 of the back B are connected. And the bezel 3 includes a fourth connection surface SC4 to which the fourth corner edge 1C4 of the front F and the fourth corner edge 2C4 of the back B are connected.

At least a part of the side S of the bezel 3 includes a curved surface.

The bezel 3 includes a through-hole 3H1 for supporting an ear jack mounted on the electronic device 2000. An ear plug may be connected to the ear jack via the through-hole 3H1. The through-hole 3H1 may be arranged on the first connection surface S1. Alternatively, an IR (Infrared Ray) sensor may be installed in place of the through-hole 3H1.

The bezel 3 includes a through-hole 3H21 for supporting a receptacle (for example, the receptacle 100 of FIG. 1) mounted on the electronic device 2000. A plug may be connected to the receptacle via the through-hole 3H21. The through-hole 3H21 may be arranged on the second connection surface S2.

The bezel 3 includes a through-hole 3H22 for supporting a microphone mounted on the electronic device 2000. Sound from the outside is introduced to the microphone via the through-hole 3H22. The through-hole 3H22 may be arranged on the second connection surface S2.

The bezel 3 includes a through-hole 3H23 for supporting a speaker mounted on the electronic device 2000. Sound from the speaker is discharged to the outside via the through-hole 3H23. The through-hole 3H23 may be arranged on the second connection surface S2.

The bezel 3 includes a through-hole 3H24 for supporting a stylus, which can be attached to and detached from the electronic device 2000. The stylus may be inserted into the inner space via the through-hole 3H24, or may be separated from the inner space via the through-hole 3H24. The through-hole 3H24 may be arranged on the second connection surface S2. Alternatively, the through-hole 3H24 may be configured to support an ear jack, and an ear plug may be connected to the ear jack via the through-hole 3H24.

The bezel 3 includes multiple through-holes 3H31 and 3H32 for supporting multiple key buttons mounted on the electronic device 2000. The multiple key buttons are exposed to the outside of the electronic device 2000 via the multiple through-holes 3H31 and 3H32. The through-holes 3H31 and 3H32 may be arranged on the third connection surface S3. Additionally, a through-hole 3H41 for supporting a key button may be arranged on the fourth connection surface S4.

The bezel 3 includes a through-hole 3H42 for supporting a memory socket mounted on the electronic device 2000. A SIM card or a memory may be inserted into the memory socket via the through-hole 3H42. The through-hole 3H42 may be arranged on the fourth connection surface S4.

The bezel 3 includes a through-hole 3HC2 for supporting an antenna mounted on the electronic device 2000. The antenna may be inserted into the inner space via the through-hole 3HC2, or may be withdrawn to the outside via the through-hole 3HC2. The through-hole 3HC2 may be arranged on the second connection surface SC2.

Figure 22:
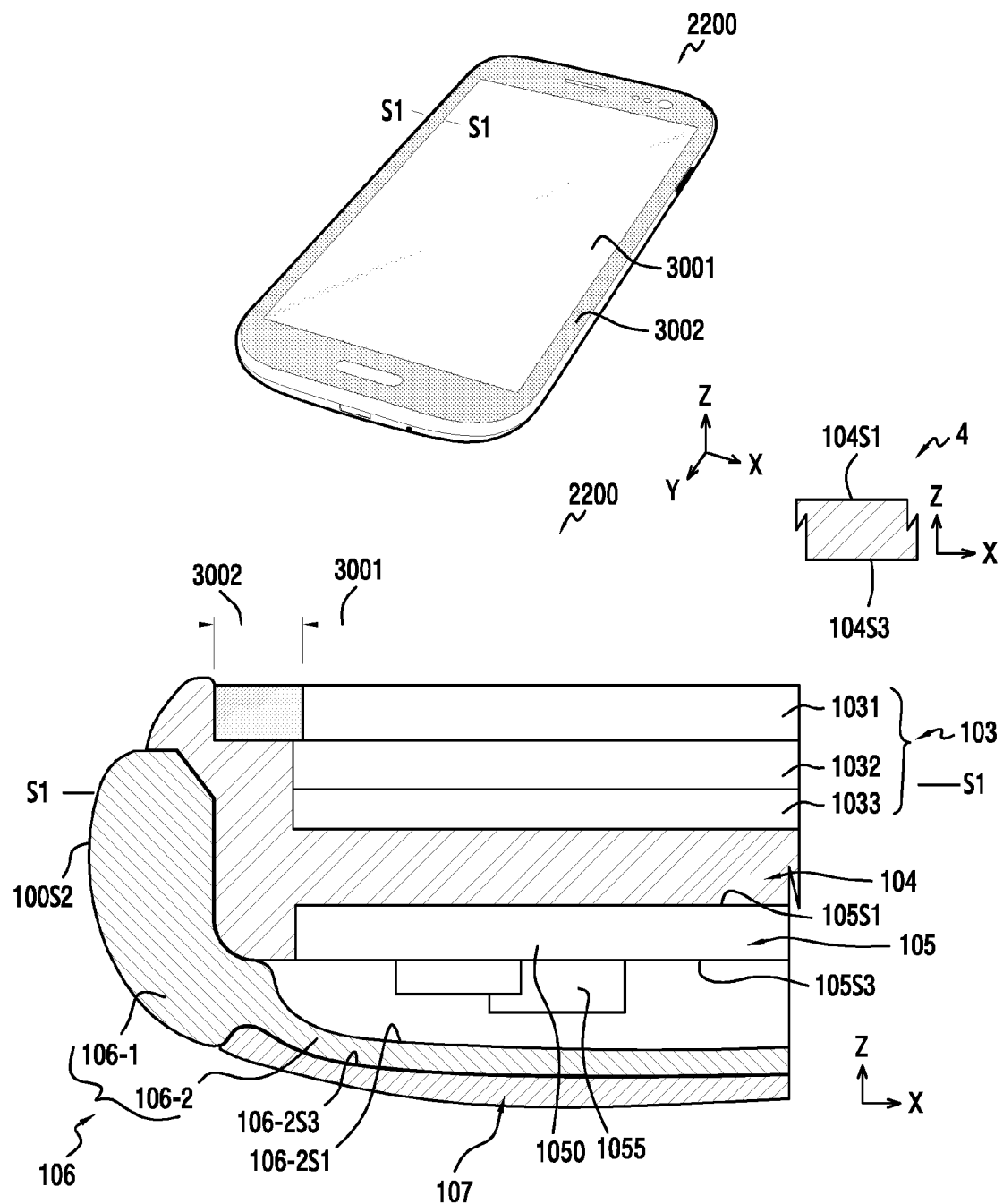
FIG. 22 is a sectional view of an electronic device, according to an embodiment of the present disclosure.

FIG. 22 is a sectional view of an electronic device, according to an embodiment of the present disclosure.

Referring to FIG. 22, an electronic device 2200 is provided. A configuration regarding a part of the electronic device 2200 is provided herein, and the configuration may not be applied to the entire electronic device 2200.

The electronic device 2200 includes a display device 103, a bracket 104, a circuit board 105, a device case 106, and a cover 107.

The display device 103 includes a window 1031, a display 1032, and a display circuit board 1033. The window 1031 may have a plate shape, may be arranged on the display 1032, and may form a surface of the electronic device 2200. The window 1031 includes plastic or glass having a degree of resistance to shock. The window 1031 forms a transparent area, which corresponds to the display surface 3001 (for example, the center area 1A1 of FIG. 21), and an opaque area, which corresponds to the non-display surface 3002 (for example, the edge areas 1E1, 1E2, 1E3, and 1E4 of FIG. 21).

The display 1032 is arranged beneath the window 1031, and images on the display 1032 are visible to the outside via the transparent area of the window 1031. The display 1032 has a plate shape.

The display circuit board 1033 is arranged beneath the display 1032, and controls output of images through the display 1032.

The display device 103 may further include a touch panel arranged between the window 1031 and the display 1032. And the display device 103 may further include a digitizer panel arranged between the display 1032 and the display circuit board 1033. The touch panel or the digitizer panel support touch input through the display surface 3001 of the display device 103.

The bracket 104 is a portion on which the display device 103 and the circuit board 105 are installed, and has a plate shape conforming to the rectangular shape of the electronic device 2200. The bracket 104 is a portion on which electronic components can be installed, and support a surface 104S1 and another surface 104S3, which face each other. As illustrated in FIG. 22, the bracket 104 is structured such that it is arranged adjacent to the circuit board 105 of the display device 103, a surface 104S1 of the bracket 104 is supported as a portion on which the display device 103 can be installed, and another surface 104S3 of the bracket 104 is supported as a portion on which the circuit board 105 can be installed. A surface 104S1 and another surface 104S3 of the bracket 104 have the shape of grooves, in which the display device 103 and the circuit board 105 can be seated, and the display device 103 and the circuit board 105 can therefore be mounted by being fitted to the bracket 104.

The bracket 104 provides the display device 103 and the circuit board 105 with rigidity. And the bracket 104 may be used to shield electromagnetic waves or to block electric noise, or may be used as a heat-radiating plate for preventing heating of electronic components. The bracket 104 may be made of metal, such as magnesium (Mg) or aluminum (Al), or may be made of a non-metallic material, such as plastic, without being limited thereto. Additionally, a material for shielding electromagnetic waves may be applied to the bracket 104.

The circuit board 105 (also referred to as a main board, a mother board, or a Printed Board Assembly (PBA) configures multiple electronic components 1055, which are mounted on a surface 105S1 and/or another surface 105S3, and an electric circuit connecting them, and sets the execution environment of the electronic device 2200, maintains information regarding the same, and supports data input/output exchange between devices inside the electronic device 2200. The circuit board 105 is arranged while being coupled to the bracket 104. The circuit board 105 may be the circuit board 200 of FIG. 6A and FIG. 6B.

A surface 105S1 of the circuit board 105 abuts at least a part of another surface 104S3 of the bracket 104, and the other surface 104S3 of the bracket 104 provides a space capable of containing electronic components installed on the surface 105S1 of the circuit board 105. A space may be provided between the other surface 105S3 of the circuit board 105 and the device case 106, and electronic components 1055 installed on the other surface 105S3 of the circuit board 105 may be contained in the space.

The device case 106 (bezel 3 of FIG. 20 and FIG. 21) has the shape of a container having an upward opening, and is coupled to the bracket 104, thereby forming the overall framework of the electronic device 2200. Electronic components (for example, a display device 103 and a circuit board 105) re mounted on a frame structure, which includes the device case 106 and the bracket 104, and exists inside the electronic device 2200. The device case 106 includes a first portion 106-1, which forms still another surface 100S2 of the electronic device 2200, and a second portion 106-2, which extends from the first case 106-1 and is arranged beneath the bracket 104. The first portion 106-1 is shaped to engage with the bracket 104 such that, as illustrated in FIG. 22, the peripheral portion of the bracket 104 can be fitted to the inside shape of the first portion 106-1, and the bracket 104 can be mounted on the device case 106 without playing. The second portion 106-2 is shaped to cover a surface 104S3 of the bracket 104, and the inside surface 106-2S1 of the second portion 106-2 may be smooth as illustrated in FIG. 22, but may have various corrugated shapes without being limited thereto. For example, the inside surface 106-2S1 of the second portion 106-2 may have at least one rib extending to the bracket 104, and the rib may play the role of supporting the bracket 104. In addition, the inside surface 106-2S1 of the second portion 106-2 may have at least one rib extending to the circuit board 105, and the rib may play the role of supporting the circuit board 105.

The second portion 106-2 may have a through-hole, and some (for example, a memory socket) of the electronic components 1055 of the circuit board 105 may be inserted into the through-hole of the second portion 106-2. When the cover 107 covers the second portion 106-2 of the device case 106, the electronic component of the circuit board 105, which is arranged in the through-hole of the second portion 106-2, is not visible. On the other hand, when the cover 107 is separated from the device case 106, the electronic component of the circuit board 105, which is arranged in the through-hole of the second portion 106-2, is exposed.

The device case 106 may include a conductive material, and may also be configured to be electrically connected to the ground surface of the circuit board 105. For example, a conductive material may be applied to the inside surface 106-2S1 of the second portion 106-2 of the device case 106. The electric connection between the conductive material of the device case 106 and the ground surface of the circuit board 105 may be caused by making the rib of the second portion 106-2 contact the ground surface of the circuit board 105. In this configuration, the rib of the second portion 106-2 includes a conductive rubber gasket for making an elastic contact with the ground surface of the circuit board 105.

The cover 107 can be coupled to the second portion 106-2 of the device case 106, and forms a surface 100S3 of the electronic device 2200. The cover 107 may be curved, and a surface 100S3 of the electronic device 2200 may be formed as a curved surface. The second portion 106-2 of the device case 106 has the shape of a groove on which the cover 107 can be seated, and the cover 107 can therefore be mounted by being fitted to the second portion 106-2 of the device case 106. And the cover 107 can be coupled to the second portion 106-2 of the device case 106 through a snap-fit, and the cover 107 can be separated from the second portion 106-2 of the device case 106. In order to attach/detach an electronic component (for example, a memory card or a battery pack), the cover 107 can be separated from the device case 106.

Figure 23:
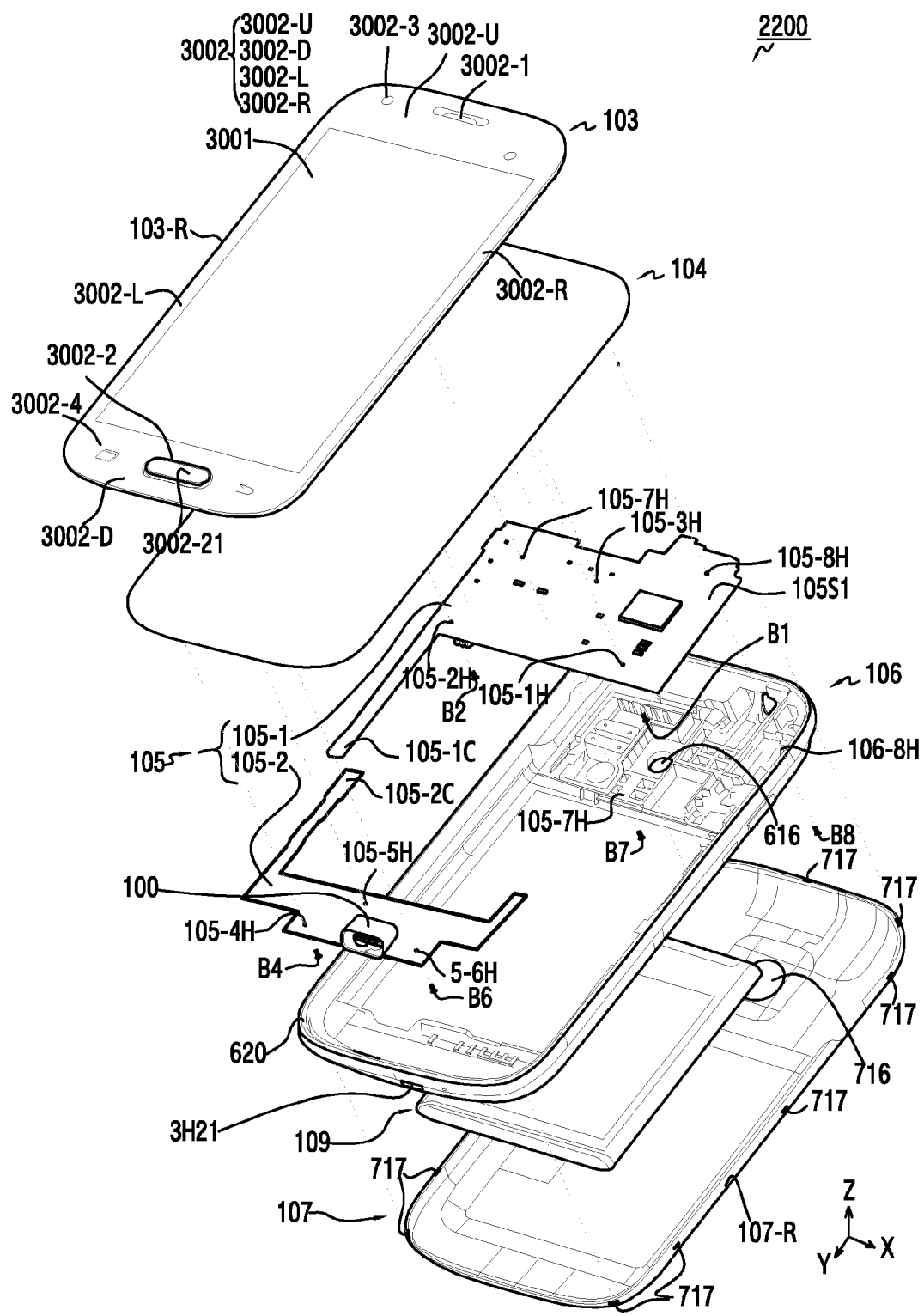
FIG. 23 illustrates an electronic device in a disassembled state, according to an embodiment of the present disclosure.

FIG. 23 illustrates an electronic device in a disassembled state, according to an embodiment of the present disclosure.

Referring to FIG. 23, the electronic device 2200 includes a display device 103, a bracket 104, a circuit board 105, a device case 106, and a battery pack 109 and a cover 107.

The display device 103 is approximately rectangular. The display device 103 includes a display area 3001 and a non-display area 3002. The display area 3001 (for example, the center area 1A1 of FIG. 21) corresponds to the screen of the display 1032 (FIG. 22). The display area 3001 has the shape of a rectangle elongated in the y-axis direction. The non-display area 3002 (for example, the edge areas 1E1, 1E2, 1E3, and 1E4 of FIG. 21) has a quadrangular, annular area surrounding the display area 3001. For example, as illustrated in FIG. 23, the non-display area 3002 includes an upper peripheral area 3002-U (for example, the edge area 1E1 of FIG. 21), a lower peripheral area 3002-D (for example, the edge area 1E2 of FIG. 21), a left peripheral area 3002-L (for example, the edge area 1E3), and a right peripheral area 3002-R (for example, the edge area 1E4 of FIG. 21). The upper peripheral area 3002-U and the lower peripheral area 3002-D are arranged to face each other. And the left peripheral area 3002-L and the right peripheral area 3002-R are arranged to face each other. The upper peripheral area 3002-U and the lower peripheral area 3002-D may have a width larger than that of the left peripheral area 3002-L or the right peripheral area 3002-R. The non-display area 3002 may be provided in the color black. Alternatively, the non-display area 302 may be a metallic texture.

The display device 103 includes a receiver hole 3002-1 arranged in the non-display area 3002 (for example, the upper peripheral area 3002-U). The receiver 3002-1 is positioned to correspond to a receiver, which is installed on the circuit board 105 or the device case 106, and sound output from the receiver is discharged to the outside via the receiver hole 3002-1.

The display device 103 includes a button hole 3002-2 arranged in the non-display area 3002 (for example, the lower peripheral area 3002-D). The display device 103 includes a button circuit arranged between the window 1031 (FIG. 22) and the bracket 104. The button 3002-21 of the button circuit is arranged on a surface of the electronic device 2200 via the button hole 3002-2.

The display device 103 further includes a transparent area 3002-3 arranged in the non-display area 3002. The transparent area 3002-3 is arranged to correspond to a sensor (for example, a luminance sensor or an image sensor) installed on the circuit board 105.

The display device 103 further includes a touch key marker 3002-4 arranged in the non-display area 3002. The touch key marker 3002-4 may be arranged on both sides of the button hole 3002-2. The display device 103 includes a touch key circuit arranged between the window 1031 and the bracket 104. The touch key circuit is arranged to correspond to the touch key marker 3002-4.

The display device 103 includes a connector (for example, a header connector), which is not shown. The connector is used to electrically connect between a display 1032 (as shown in FIG. 22) installed on the display device 103 and/or a touch input device (for example, a touch panel or a digitizer panel) and the circuit board 105. Alternatively, the connector may be used to electrically connect between a button circuit installed on the display device 103 or a touch key circuit and the circuit board 105.

The circuit board 105 is arranged between the bracket 104 and the device case 106. The circuit board 105 includes multiple separable circuit boards 105-1 and 105-2. For example, the circuit board 105 includes a first circuit board 105-1 and a second circuit board 105-2, which are arranged on both sides of the electronic device 2200, respectively. The first circuit board 105-1 includes a first connector 105-1C shaped to protrude relative to other parts. And the second circuit board 105-2 includes a second connector 105-2C shaped to protrude relative to other parts. The first connector 105-1C and the second connector 105-2C are connected, and the first circuit board 105-1 and the second circuit board 105-2 are electrically connected.

The receptacle 100 is installed on the circuit board 105 (for example, the second circuit board 105-2). The device case 106 includes a through-hole 3H21 for supporting the receptacle 100 mounted on the circuit board 105. A plug may be connected to the receptacle via the through-hole 3H21.

The circuit board 105 includes multiple bolt holes 105-1H, 105-2H, 105-3H, 105-4H, 105-5H, 105-6H, 105-7H, and 105-8H. The multiple bolt holes 105-1H, 105-2H, 105-3H, 105-4H, 105-5H, 105-6H, 105-7H, and 105-8H are arranged to correspond to multiple bosses of the bracket 104.

Multiple bolts B1, B2, B4, and B6 penetrate the multiple bolt holes 105-1H, 105-2H, 105-3H, 105-4H, 105-5H, and 105-6H of the circuit board 105 and are fastened to multiple bosses of the bracket 104, and, as a result, the circuit board 105 and the bracket 104 can be coupled together.

The device case 106 includes multiple bolt holes 106-7H and 106-8H. The multiple bolt holes 106-7H and 106-8H are arranged to correspond to multiple bolt holes 105-7H and 105-8H of the circuit board 105. Multiple bolts B7 and B8 penetrate the multiple bolt holes 106-7H and 106-8H of the device case 106 and the multiple bolt holes 105-7H and 105-8H of the circuit board 105 and are fastened to multiple bosses of the bracket 104, and, as a result, the device case 106, the circuit board 105, and the bracket 104 are coupled together. The display device 103 is finally coupled to the bracket 104 after the device case 106, the circuit board 105, and the bracket 104 are coupled.

The device case 106 includes an open portion 620 on which the bracket 104 is installed. The circuit board 105 is arranged in a space formed by coupling between the device case 106 and the bracket 104.

The device case 106 may include a conductive material, which reduces electric noise of the electronic device 2200 or diffuses heat from a heat-generating component (for example, the circuit board 105).

The device case 106 includes a transparent window 616. For example, the transparent window 616 is arranged to correspond to an optical electronic component (for example, a camera module) arranged on a surface 105S3 (as shown in FIG. 22) of the circuit board 105.

The battery pack 109 is arranged on a battery pack installation portion formed on a surface 106-2S3 (FIG. 22) of the device case 106.

The cover 107 is arranged beneath the device case 106. The cover 107 includes a through-hole 716 and multiple hooks 717. The through-hole 716 is arranged to correspond to the transparent window 616 of the device case 106. The multiple hooks 717 are arranged on a periphery 107-R. The multiple hooks 717 are fastened to multiple hook fastening grooves, and the cover 107 is coupled to the device case 106.

The cover 107 may include a conductive material. The conductive material reduces the electric noise of the electronic device 2200. Alternatively, the conductive material diffuses heat from a heat-generating component (for example, the circuit board 105).

The electronic device 2200 may further include a circuit device including an antenna or a speaker, which is arranged between the second circuit board 105-2 and the device case 106. For example, a terminal (for example, an elastic terminal) of the circuit device may electrically contact a terminal arranged on a surface of the second circuit board 105-2. The circuit device may be shaped such that an antenna or a speaker is arranged on an injection molded object.

Figure 24A:
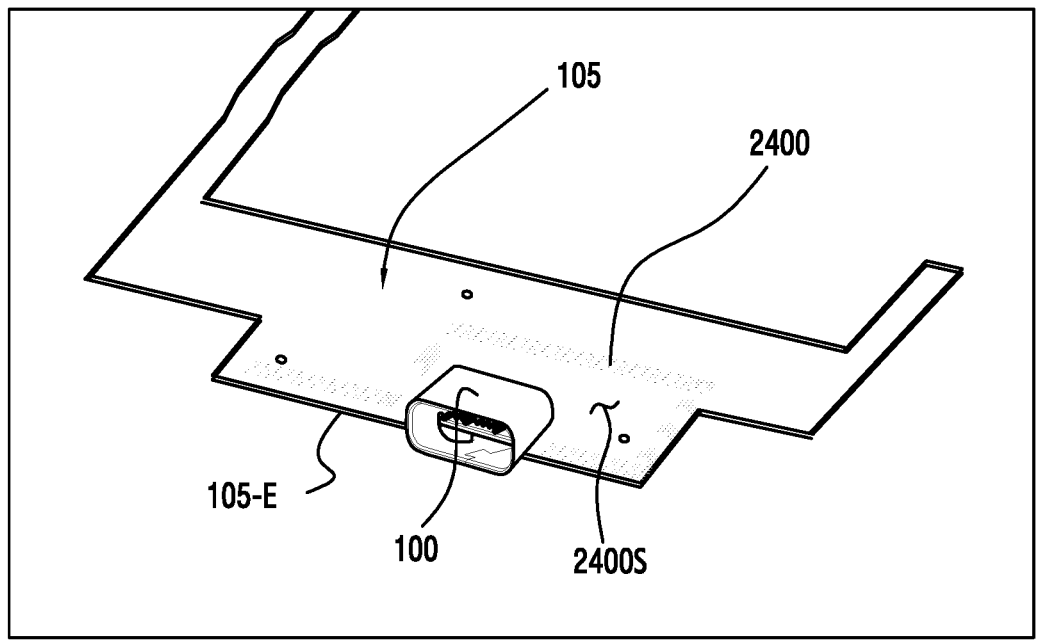
FIG. 24A illustrates a receptacle and a circuit board, according to an embodiment of the present disclosure.

FIG. 24A illustrates a receptacle and a circuit board, according to an embodiment of the present disclosure.

Referring to FIG. 24A, the receptacle 100 is installed on the circuit board 105 in a mid-mount installation structure or a top mount installation structure.

The circuit board 105 includes a conductive pattern 2400 used as an antenna. The conductive pattern 2400 forms a transmission line for receiving a current from the circuit board 105 and emitting radio waves. The shape of the conductive pattern 2400 may be implemented variously according to the communication used by the electronic device 1000.

The antenna of the electronic device 1000 is arranged on a non-conducive structure (for example, a carrier) mounted on the circuit board 105.

The conductive pattern 2400 is arranged in an area of the circuit board 105 near the receptacle 100. For example, the receptacle 100 is positioned near an edge of the electronic device 1000 to enable insertion of a plug of an external device (for example, a charger), and the receptacle 100 is arranged near an edge 105-E of the circuit board 105. In addition, the conductive pattern 2400 is arranged near an edge of the electronic device 100 in order to improve the antenna performance or reduce the Specific Absorption Rate (SAR). To this end, the conductive pattern 2400 is arranged near an edge 105-E of the circuit board 105. Therefore, a predetermined area of the circuit board 105 is divided into an area in which the receptacle 100 is installed and another area in which the conductive pattern 2400 is installed.

The receptacle 100 of an embodiment of the present invention has a size smaller than that of a receptacle 1100 (as shown in FIG. 7A) of the prior art, thereby securing a larger area on the circuit board 105, in which the conductive pattern 2400 is to be installed. Therefore, the conductive pattern 2400 can be installed using the secured area, which leads to improvement of the antenna performance.

Additionally, the conductive pattern 2400 is arranged so as not to overlap the receptacle 100. In this configuration, the receptacle 100 has a size smaller than that of a receptacle 1100 of the prior art, thereby securing a larger area on the circuit board 105, in which the conductive pattern 2400 is to be installed; this makes it possible to secure an area, in which the conductive pattern 2400 is to be installed, without being influenced by the area of installation of the receptacle 100, helping to improve the antenna performance.

It is also possible to design circuit board 105 and receptacle 100 configuration such that radio waves can be emitted using an empty area or slot 2400S, which is formed by the conductive pattern 2400. In this configuration, the receptacle 100 has a size smaller than that of a receptacle 1100 of the prior art, thereby securing a larger area on the circuit board 105, in which the conductive pattern 2400 is to be installed; this makes it easy to form the slot 2400S and to help improve the antenna performance.

Figure 24B:
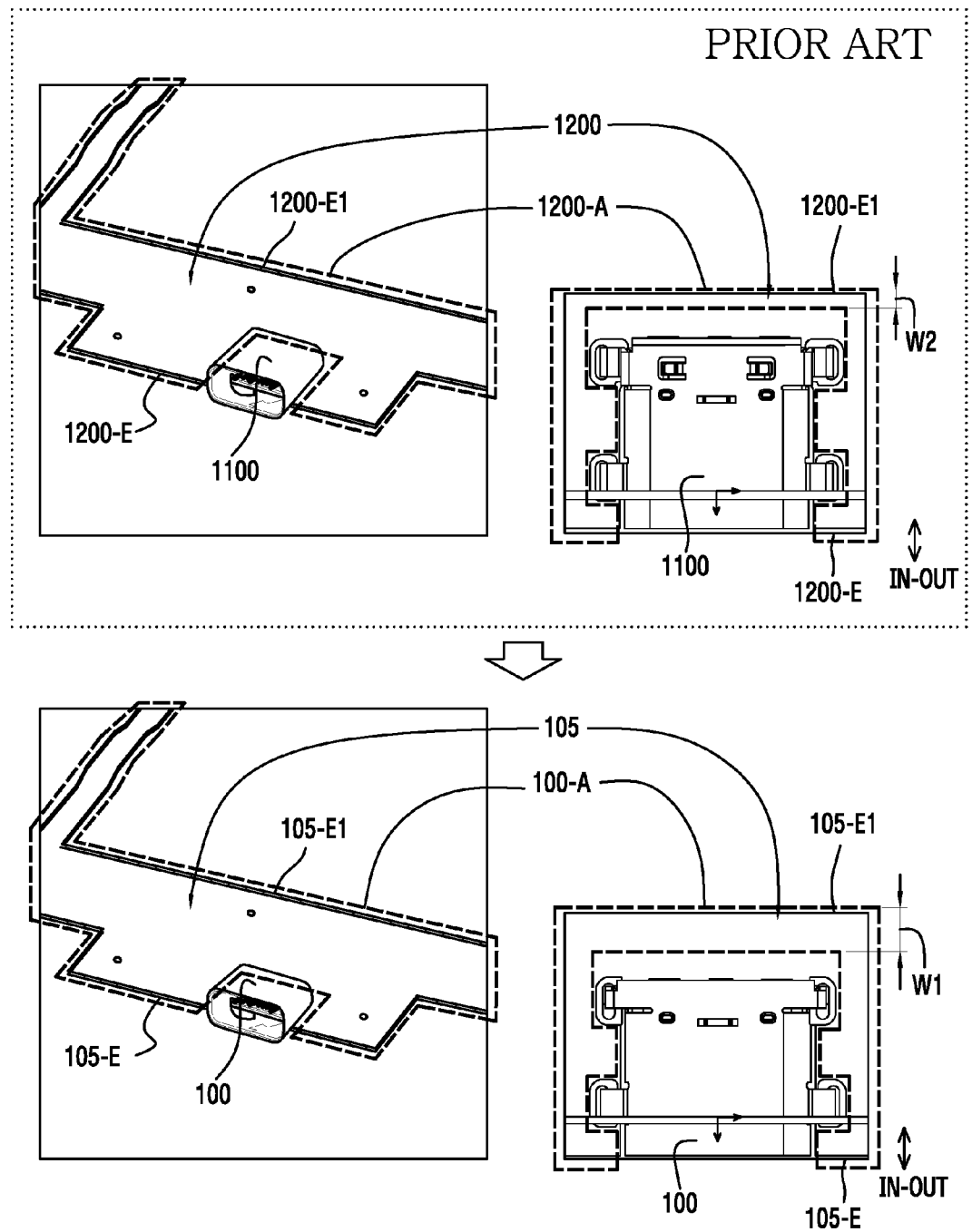
FIG. 24B is a diagram comparing an antenna installation area in connection with a circuit board, according to the prior art, and an antenna installation area in connection with a circuit board, according to an embodiment of the present disclosure.

FIG. 24B is a diagram comparing an antenna installation area in connection with a circuit board, according to the prior art, and an antenna installation area in connection with a circuit board, according to an embodiment of the present disclosure.

Referring to FIG. 24B, a circuit board 1200 according to the prior art and a circuit board 105 according to an embodiment of the present invention is provided. It will be assumed in this configuration, that the circuit board 1200 and the circuit board 105 have an approximately identical component installation area.

The antenna installation area 1200-A of the circuit board 1200, which corresponds to the component installation area excluding the area in which the receptacle 1100 is installed, may be smaller than the antenna installation area 100-A of the circuit board 105, which corresponds to the component installation area excluding the area in which the receptacle 100 is installed. This is because the receptacle 100 of an embodiment of the present disclosure has a size smaller than that of the receptacle 1100 of the prior art. For example, with regard to the plug entry/exit direction (IN-OUT), the width W1 that is not occupied by the receptacle 100 between opposite edges 105-E and 105-E1 of the circuit board 105 is larger than the width W2 that is not occupied by the receptacle 100 between opposite edges 1200-E and 1200-E1 of the circuit board 1200. Therefore, the structure of coupling between the circuit board 105 and the receptacle 100 provides a larger area, in which an antenna (for example, a conductive pattern 2400 of FIG. 6A) can be installed, with regard to the plug entry/exit direction IN-OUT as compared with the structure of coupling between the circuit board 1200 and the receptacle 1100.

The structure of coupling between the circuit board 105 and the receptacle 100 provides a larger area, in which an antenna (for example, a conductive pattern 2400 of FIG. 6A) can be installed, with regard to a direction perpendicular to the plug entry/exit direction IN-OUT as compared with the structure of coupling between the circuit board 1200 and the receptacle 1100.

Figure 25:
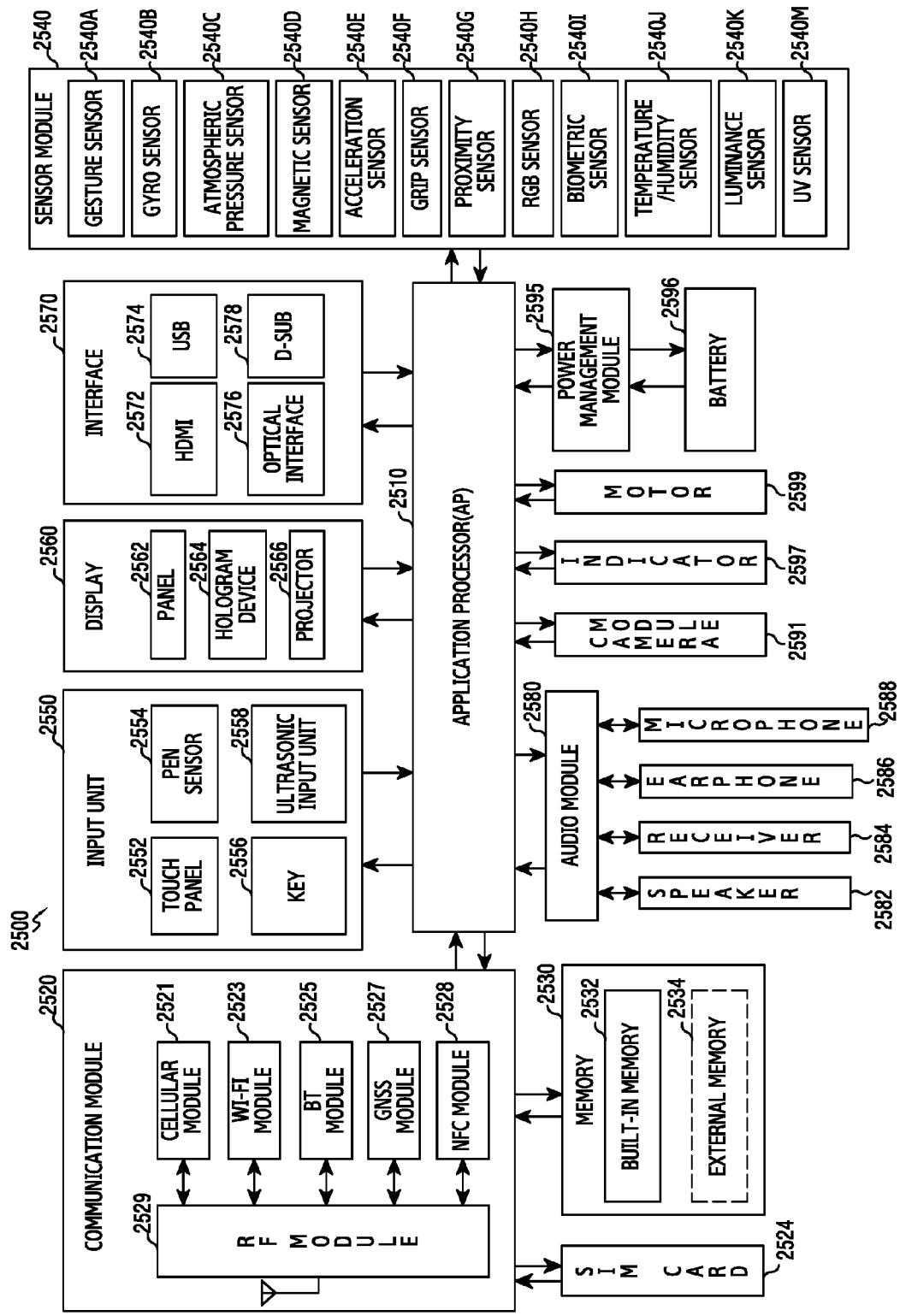
FIG. 25 is a block diagram of an electronic device, according to various embodiments.

FIG. 25 is a block diagram of an electronic device, according to various embodiments.

Referring to FIG. 25, an electronic device 2500 is provided. The electronic device 2500 includes at least one application processor (AP) 2510, a communication module 2520, a subscriber identification module (SIM) card 2524, a memory 2530, a sensor module 2540, an input unit 2550, a display 2560, an interface 2570, an audio module 2580, a camera module 2591, a power management module 2595, a battery 2596, an indicator 2597, and a motor 2598.

The processor 2510 controls a plurality of hardware or software components connected to the processor 2510 by driving an operating system or an application program and performs processing of various pieces of data and calculations. The processor 2510 may be implemented by, for example, a System on Chip (SoC). The processor 2510 may further include a GPU (graphic processing unit) and/or an image signal processor. The processor 2510 may include at least some (e.g., a cellular module 2521) of the elements illustrated in FIG. 25. The processor 2510 loads, into a volatile memory, instructions or data received from at least one (e.g., a non-volatile memory) of the other elements and processes the loaded instructions or data, and stores various data in a non-volatile memory.

The communication module 2520 includes, for example, a cellular module 2521, a Wi-Fi module 2523, a Bluetooth (BT) module 2525, a Global Navigation Satellite System (GNSS) module 2527 (for example, a GPS module, a Glonass module, a Beidou module, or a Galileo module), an Near Field Communication (NFC) module 2528, and a Radio Frequency (RF) module 2529.

The cellular module 2521 provides a voice call, image call, a text message service, or an Internet service through a communication network. The cellular module 2521 performs recognition and authentication of an electronic device 2501 within a communication network using the SIM card 2524. The cellular module 2521 may perform at least a part of the functions which can be provided by the processor 2510. The cellular module 2521 may include a Communication Processor (CP).

Each of the Wi-Fi module 2523, the BT module 2525, the GNSS module 2527, and the NFC module 2528 may include, for example, a processor for processing data transmitted and received through the relevant module. At least some of the cellular module 2521, the WIFI module 2523, the BT module 2525, the GPS module 2527, and the NFC module 2528 may be included in one Integrated Chip (IC) or IC package.

The RF module 2529 transmits/receives a communication signal (for example, an RF signal). The RF module 2529 may include, for example, a transceiver, a Power Amp Module (PAM), a frequency filter, a Low Noise Amplifier (LNA), or an antenna. Alternatively, at least one of the cellular module 2521, the Wi-Fi module 2523, the BT module 2525, the GPS module 2527, and the NFC module 2528 may transmit/receive an RF signal through a separate RF module.

The SIM card 2524 is a card inserted into a slot of the electronic device 2500. The SIM card 2524 contains unique identification information (e.g., an Integrated Circuit Card Identifier (ICCID)) or subscriber information (e.g., an International Mobile Subscriber Identity (IMSI)).

The memory 2530 includes an internal memory 2532 or an external memory 2534. The internal memory 2532 includes for example, a volatile memory (for example, a Dynamic Random Access Memory (DRAM), a Static RAM (SRAM), a Synchronous Dynamic RAM (SDRAM), and the like) and a non-volatile memory (for example, a One Time Programmable Read Only Memory (OTPROM), a Programmable ROM (PROM), an Erasable and Programmable ROM (EPROM), an Electrically Erasable and Programmable ROM (EEPROM), a flash memory (for example, a NAND flash memory or a NOR flash memory), a hard driver, or a Solid State Drive (SSD).

The external memory 2534 includes, for example, a flash drive, for example, a Compact Flash (CF), a Secure Digital (SD), a Micro Secure Digital (Micro-SD), a Mini Secure Digital (Mini-SD), an eXtreme Digital (xD), a memory stick, or the like. The external memory 2534 may be functionally and/or physically connected to the electronic device 2500 through various interfaces.

The sensor module 2540 measures a physical quantity or detects an operation state of the electronic device 2500, and converts the measured or detected information into an electrical signal. The sensor module 2540 may include, for example, at least one of a gesture sensor 2540A, a gyro sensor 2540B, an atmospheric pressure sensor 2540C, a magnetic sensor 2540D, an acceleration sensor 2540E, a grip sensor 2540F, a proximity sensor 2540G, a color (for example, a red, green, blue (RGB)) sensor 2540H, a biometric sensor 2540I, a temperature/humidity sensor 2540J, a luminance sensor 2540K, and a ultraviolet (UV) sensor 2540M. Additionally or alternatively, the sensor module 2540 may include an E-nose sensor, an electromyography (EMG) sensor, an electroencephalogram (EEG) sensor, an electrocardiogram (ECG) sensor, an infrared (IR) sensor, an iris sensor, and/or a fingerprint sensor. The sensor module 2540 may further include a control circuit for controlling one or more sensors included therein. The electronic apparatus 2500 may further include a processor configured to control the sensor module 2540 as a part of or separately from the processor 2510, and may control the sensor module 2540 while the processor 2510 is in a sleep state.

The input device 2550 includes, for example, a touch panel 2552, a (digital) pen sensor 2554, a key 2556, or an ultrasonic input device 2558. The touch panel 2552 may use for example, a capacitive type, a resistive type, an infrared type, and an ultrasonic type. Also, the touch panel 2552 may further include a control circuit. The touch panel 2552 may further include a tactile layer and provide a tactile reaction to the user.

The (digital) pen sensor 2554 may include, for example, a recognition sheet which is a part of the touch panel or is separated from the touch panel.

The key 2556 may include, for example, a physical button, an optical key or a keypad.

The ultrasonic input device 2558 detects ultrasonic wavers generated by an input tool through a microphone 2588 and identifies data corresponding to the detected ultrasonic waves.

The display 2560 may include a panel 2562, a hologram device 2564, or a projector 2566.

The panel 2562 may be implemented to be, for example, flexible, transparent, or wearable. The panel 2562 and the touch panel 2552 may be implemented as one module.

The hologram device 2564 displays a three dimensional image in the air by using an interference of light.

The projector 2566 displays an image by projecting light onto a screen. The screen may be located inside or outside the electronic apparatus 2500.

The display 2560 may further include a control circuit for controlling the panel 2562, the hologram device 2564, or the projector 2566.

The interface 2570 may include, for example, a High-Definition Multimedia Interface (HDMI) 2572, a Universal Serial Bus (USB) 2574, an optical interface 2576, or a D-subminiature (D-sub) 2578. Additionally or alternatively, the interface 2570 may include, for example, a Mobile High-definition Link (MHL) interface, a Secure Digital (SD) card/Multi-Media Card (MMC) interface, or an Infrared Data Association (IrDA) standard interface.

The interface 2570 may include a C-type receptacle 100 for a USB communication interface installed on the circuit board 200 (as shown in FIG. 6A and FIG. 6B).

The audio module 2580 bilaterally converts a sound and an electrical signal. The audio module 2580 processes sound information which is input or output through, for example, a speaker 2582, a receiver 2584, earphones 2586, and the microphone 2588.

The camera module 2591 is a device capable of taking still and moving images and includes one or more image sensors (for example, a front sensor or a back sensor), a lens, an Image Signal Processor (ISP), or a flash (for example, LED or xenon lamp).

The power management module 2595 manages power of the electronic device 2500. The power management module 2595 includes a PMIC (power management integrated circuit), a charger IC (charger integrated circuit), or a battery gauge.

The PMIC may use a wired and/or wireless charging method. Examples of the wireless charging method includes, for example, a magnetic resonance method, a magnetic induction method, an electromagnetic method, etc. Additional circuits (e.g., a coil loop, a resonance circuit, a rectifier, etc.) for wireless charging may be further included.

The battery gauge measures, for example, a residual quantity, a voltage, a current, or a temperature of the battery 2596 during charging. The battery 2596 includes, for example, a rechargeable battery or a solar battery.

The indicator 2597 displays a particular state (e.g., a booting state, a message state, a charging state, or the like) of the electronic device 2500 or a part (e.g., the processor 2510) thereof.

The motor 2598 converts an electrical signal into mechanical vibration, and generates a vibration, a haptic effect, etc.

The electronic apparatus 2501 may include a processing unit (e.g., a GPU) for supporting a mobile television (TV). The processing unit for supporting mobile TV processes media data according to a certain standard, such as Digital Multimedia Broadcasting (DMB), Digital Video Broadcasting (DVB), or mediaFLO™.

An electronic device may include a circuit board including multiple lands arranged on a surface; and an electrical receptacle including multiple contacts electrically connected to the multiple lands, the electrical receptacle being installed on the circuit board. In this configuration, at least one (for example, at least two) contacts are connected to at least one land among the multiple lands.

The multiple lands may be arranged in one row. The multiple lands may have a constant width or an inconstant width. The multiple lands may be arranged at a constant interval or at an inconstant interval. The multiple lands may be arranged in a direction perpendicular to a direction of inserting a plug into the receptacle. The number of the multiple lands may be smaller than the number of the multiple contacts.

The receptacle may include a conductive receptacle shell comprising a passage, into which a plug can be inserted, and a receptacle tongue comprising a free end portion having a shape of a plate arranged inside the passage of the receptacle shell. And the multiple contacts may include multiple first sections arranged on opposite surfaces of the free end portion of the receptacle tongue to be electrically connected to the plug; and multiple second sections extending from the multiple first sections and having tails coupled to the multiple lands using soldering.

At least two of the tails of the multiple second sections may be coupled together to one land among the multiple lands.

At least two tails coupled together to one land among the multiple lands may include both a tail extending from at least one first section arranged on a first surface of the free end portion of the receptacle tongue, among the multiple first sections, and a tail extending from at least one first section arranged on a second surface of the free end portion of the receptacle tongue, among the multiple first sections.

Tails of the at least two second sections coupled together to one land among the multiple lands may be stacked and arranged on the one land in a vertical direction.

Tails of the at least two second sections coupled together to one land among the multiple lands may be arranged on the one land in a horizontal direction.

A space for solder rising may be formed between tails of the at least two second sections coupled together to one land among the multiple lands.

The number of multiple first sections arranged on the first surface of the free end portion of the receptacle tongue and the number of multiple first sections arranged on the second surface of the free end portion of the receptacle tongue may be identical.

The circuit board includes multiple component holes electrically connected to a ground. In addition, the receptacle may include multiple leads extending from the conductive receptacle shell. Furthermore, the receptacle may be coupled to the circuit board by inserting the multiple leads into the multiple component holes and then performing soldering. In addition, the conducive receptacle shell may be used as a ground return path of the circuit board.

The multiple lands may be arranged between a pair of component holes among the multiple component holes.

The receptacle tongue include a conductive mid-plate arranged inside the free end portion of the receptacle tongue. And the conductive mid-plate may include at least one extension portion electrically connected to multiple leads of the receptacle shell or to the multiple component holes, and may be used as a ground return path of the circuit board.

The electronic device may further include at least one additional conductive contact arranged on the free end portion of the receptacle tongue to be electrically connected to the plug. And the additional conductive contact may be electrically connected to the conductive mid-plate.

The at least one additional conductive contact may be arranged on the first surface or the second surface of the free end portion of the receptacle tongue, and may be arranged closer to the outer side than the multiple first sections.

The electronic device may further include a conductive pattern installed on the circuit board and used as an antenna. And the conductive pattern may not overlap with the receptacle.

The receptacle may include a reversible connector.

The receptacle supports at least one communication specification.

The at least one communication specification includes at least one of USB 3.x and USB 2.x.

An electronic device includes a circuit board including multiple lands arranged on a surface in one row; and an electrical receptacle including multiple contacts electrically connected to the multiple lands, the electrical receptacle being installed on the circuit board. The receptacle, compared with a predetermined receptacle supporting multiple communication specifications, may solely include the multiple contacts corresponding to the only one communication specification supported by the electronic device.

At least two contacts may be connected to one land among the multiple lands.

The number of the multiple lands may be smaller than the number of the multiple contacts.

The electronic device may support a communication specification of a relatively lower version among multiple communication specifications.

A predetermined receptacle, which supports multiple communication specifications, may support a USB 3.x communication specification and a USB 2.x communication specification.

The electronic device may support only the USB 2.x communication specification.

The receptacle includes a C-type connector or a reversible connector.

An electronic device may include a circuit board including multiple lands arranged on a surface in one row; and an electrical receptacle including multiple contacts electrically connected to the multiple lands, the electrical receptacle being installed on the circuit board. The receptacle, compared with a universal receptacle supporting both a communication specification of an upper version and a communication specification of a lower version, may include only the multiple contacts corresponding to the communication specification of the lower version supported by the electronic device.

At least two contacts are connected to one land among the multiple lands.

The number of the multiple lands may be smaller than the number of the multiple contacts.

The communication specification of the upper version may be USB 3.x, and the communication specification of the lower version may be USB 2.x.

The receptacle includes a C-type connector or a reversible connector.

Each of the above-described component elements of hardware according to the present disclosure may be configured with one or more components, and the names of the corresponding component elements may vary based on the type of electronic device. In various embodiments, the electronic device may include at least one of the above-described elements. Some of the above-described elements may be omitted from the electronic device, or the electronic device may further include additional elements. Also, some of the hardware components according to various embodiments may be combined into one entity, which may perform functions identical to those of the relevant components before the combination.

Various embodiments of the present disclosure disclosed in this specification and the drawings are merely specific examples presented in order to easily describe technical details of the present disclosure and to help the understanding of the present disclosure, and are not intended to limit the scope of the present disclosure. Therefore, it should be understood that, in addition to the embodiments disclosed herein, all modifications and changes or modified and changed forms derived from the technical idea of various embodiments of the present disclosure fall within the scope of the present disclosure as set forth by the following claims and their equivalents.

What is claimed is:

1. An electronic device comprising:
a circuit board comprising multiple lands arranged on a surface; and
an electrical receptacle comprising multiple contacts electrically connected to the multiple lands, the electrical receptacle being installed on the circuit board,
wherein the receptacle comprises:
a tongue disposed in a shell of the receptacle;
multiple first sections of the multiple contacts arranged on opposite surfaces of the tongue to be electrically connected to a plug when the plug is inserted into the shell; and
multiple second sections of the multiple contacts extending from the multiple first sections and having tails coupled to the multiple lands using solder,
wherein at least two tails of the multiple second sections are stacked on one land among the multiple lands.

2. The electronic device of claim 1, wherein the multiple lands have a constant width or a variable width, or are arranged at a constant interval or at a variable interval.

3. The electronic device of claim 1, wherein a number of the multiple lands is smaller than a number of the multiple contacts.

4. The electronic device of claim 1, further comprising a conductive pattern installed on the circuit board and used as an antenna, the conductive pattern not overlapping with the receptacle.

5. The electronic device of claim 1, wherein the at least two tails of the multiple second sections coupled to the one land among the multiple lands comprise both a tail extending from at least one first section, arranged on a first surface of of the tongue, among the multiple first sections, and a tail extending from at least one first section, arranged on a second the tongue, among the multiple first sections.

6. The electronic device of claim 1,
wherein another two or more tails of the multiple second sections are stacked on another one land among the multiple lands side by side.

7. The electronic device of claim 1, wherein the multiple first sections are divided into two groups of a same number on the opposite surfaces of the tongue.

8. The electronic device of claim 1, wherein the receptacle is a receptacle for Universal Serial Bus (USB) 3.x protocol.

9. The electronic device of claim 1, wherein the receptacle comprises a C-type connector or a reversible connector.

10. The electronic device of claim 1, wherein the shell is electrically conductive.

11. The electronic device of claim 10, wherein the circuit board comprises multiple component holes electrically connected to a ground,
the receptacle comprises multiple leads extending from the shell,
the receptacle is coupled to the circuit board by inserting the multiple leads into the multiple component holes and then performing soldering, and
the shell is used as a ground return path of the circuit board.

12. The electronic device of claim 11, wherein the multiple lands are arranged between a pair of component holes among the multiple component holes.

13. The electronic device of claim 11, wherein the tongue comprises a conductive mid-plate arranged inside a free end portion of the tongue, and
wherein the conductive mid-plate comprises at least one extension portion electrically connected to multiple leads of the shell or to the multiple component holes, and is used as a ground return path of the circuit board.

14. The electronic device of claim 13, further comprising at least one additional conductive contact arranged on the free end portion of the tongue to be electrically connected to the plug, the at least one additional conductive contact being electrically connected to the conductive mid-plate.

15. The electronic device of claim 1, wherein the multiple lands are arranged in a single row.

16. The electronic device of claim 15, wherein the multiple lands are arranged in a direction perpendicular to a direction of inserting the plug into the receptacle.

17. An electronic device comprising:
a circuit board comprising multiple lands arranged on a surface; and
an electrical receptacle comprising multiple contacts electrically connected to the multiple lands, the electrical receptacle being installed on the circuit board, wherein the multiple lands are arranged in a single row, and
wherein the receptacle comprises:
a tongue disposed in a shell of the receptacle;
multiple first sections of the multiple contacts arranged on opposite surfaces of the tongue to be electrically connected to a plug when the plug is inserted into the shell; and
multiple second sections of the multiple contacts extending from the multiple first sections and having tails coupled to the multiple lands using solder,
wherein at least two tails of the multiple second sections are coupled to one land among the multiple lands, and
wherein the at least two tails of the multiple second sections are bent in opposing directions.

18. An electronic device comprising:
a circuit board comprising multiple lands arranged on a surface; and
an electrical receptacle comprising multiple contacts electrically connected to the multiple lands, the electrical receptacle being installed on the circuit board,
wherein the receptacle comprises:
a tongue disposed in a shell of the receptacle;
multiple first sections of the multiple contacts arranged on opposite surfaces of the tongue to be electrically connected to a plug when the plug is inserted into the shell; and
multiple second sections of the multiple contacts extending from the multiple first sections and having tails coupled to the multiple lands using solder,
wherein at least two tails of the multiple second sections are coupled to one land among the multiple lands side by side, and wherein a portion of the solder is disposed between the at least two tails.

* * * * *